(12) United States Patent
Watanabe et al.

(10) Patent No.: US 11,869,789 B2
(45) Date of Patent: Jan. 9, 2024

(54) SUBSTRATE PROCESSING APPARATUS AND SUBSTRATE PROCESSING METHOD

(71) Applicant: Tokyo Electron Limited, Tokyo (JP)

(72) Inventors: Tsuyoshi Watanabe, Koshi (JP); Masashi Tsuchiyama, Koshi (JP); Suguru Enokida, Koshi (JP); Taro Yamamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 2 days.

(21) Appl. No.: 17/533,672

(22) Filed: Nov. 23, 2021

(65) Prior Publication Data

US 2022/0165597 A1 May 26, 2022

(30) Foreign Application Priority Data

Nov. 25, 2020 (JP) ................. 2020-195412

(51) Int. Cl.
*H01L 21/677* (2006.01)
*G03F 7/16* (2006.01)
(52) U.S. Cl.
CPC ........ *H01L 21/67712* (2013.01); *G03F 7/168* (2013.01); *H01L 21/67766* (2013.01)
(58) Field of Classification Search
CPC ......... H01L 21/67712; H01L 21/67766; H01L 21/67745
See application file for complete search history.

(56) References Cited

U.S. PATENT DOCUMENTS

| | | | |
|---|---|---|---|
| 2006/0182535 A1* | 8/2006 | Rice | H01L 21/67173 414/217 |
| 2020/0206788 A1* | 7/2020 | Kuwahara | H01L 21/68707 |
| 2020/0211868 A1* | 7/2020 | Kuwahara | H01L 21/67276 |
| 2020/0211880 A1* | 7/2020 | Kuwahara | H01L 21/67733 |
| 2020/0211881 A1* | 7/2020 | Kuwahara | H01L 21/6773 |

FOREIGN PATENT DOCUMENTS

JP 2008-258208 A 10/2008

\* cited by examiner

*Primary Examiner* — Gerald McClain
(74) *Attorney, Agent, or Firm* — Nath, Goldberg & Meyer; Jerald L. Meyer; Tanya E Harkins

(57) ABSTRACT

A substrate processing apparatus includes a carrier block, a first processing block including first lower and upper processing blocks to deliver a substrate to and from the carrier block, a second processing block including second lower and upper processing blocks provided adjacent to the first lower and upper processing blocks, a relay block including a lifting and transferring mechanism that delivers the substrate between the second lower and upper processing blocks, a controller that controls an operation of each main transfer mechanism such that one of upper and lower processing blocks forms an outward path through which the substrate is transferred from the carrier block to the relay block and the other forms a return path through which the substrate is transferred from the relay block to the carrier block, and a bypass transfer mechanism provided for each of the first and second processing blocks.

17 Claims, 13 Drawing Sheets

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2020-195412, filed on Nov. 25, 2020, the entire contents of which are incorporated herein by reference.

TECHNICAL FIELD

The present disclosure relates to a substrate processing apparatus and a substrate processing method.

BACKGROUND

In a semiconductor device manufacturing process, a semiconductor wafer (hereinafter referred to as a "wafer") is transferred among various kinds of processing modules so that various processes such as a liquid process and a heating process are performed thereon. Patent Document 1 discloses a coating and developing apparatus including a plurality of unit blocks each of which is provided with a plurality of processing modules and which are stacked one above another, and processing blocks S2 and S4 each of which includes a main arm provided for each unit block in order to transfer the wafer among the processing modules. The processing blocks S2 and S4 are sandwiched between a carrier block and an exposure apparatus, and a block S3 for lifting and transferring the wafer is interposed between the processing blocks S2 and S4. A unit block below each of the processing blocks S2 and S4 is provided with a plurality of shuttle arms for transferring wafers without going through the processing module, as a transfer mechanism different from the main arm.

The wafers transferred to the block S3 using the shuttle arm of the processing block S2 are distributed to the unit blocks above the processing blocks S2 and S4 and then returned to the block S3 to be transferred to the exposure apparatus using the shuttle arms of the processing block S4. Thereafter, when a process is performed in one of the processing blocks S2 and S4, the wafer is transferred to the side of the carrier block by using a shuttle arm to bypass the processing module of the block that does not perform the process.

PRIOR ART DOCUMENT

[Patent Document]
Patent Document 1: Japanese Laid-Open Patent Publication No. 2008-258208

SUMMARY

A substrate processing apparatus according to an embodiment of the present disclosure includes: a carrier block on which a carrier configured to store a substrate is placed; a first processing block including a first lower processing block and a first upper processing block and configured to deliver the substrate to and from the carrier block, the first lower processing block and the first upper processing block being stacked one above another, wherein each of the first lower processing block and the first upper processing block includes a plurality of layers, which are stacked one above another, and a main transfer mechanism shared by each of the plurality of layers to transfer the substrate, and wherein each of the plurality of layers is provided with a processing module configured to process the substrate; a second processing block including a second lower processing block and a second upper processing block, which are adjacent, in a left-right direction, to the first lower processing block and the first upper processing block, respectively, and are stacked one above another, wherein each of the second lower processing block and the second upper processing block includes a plurality of layers, which are stacked one above another, and a main transfer mechanism shared by each of the plurality of layers to transfer the substrate; a relay block including a lifting and transferring mechanism configured to deliver the substrate between the second lower processing block and the second upper processing block, wherein the relay block is located adjacent to the second processing block at a side opposite to a side at which the first processing block is located adjacent to the second processing block in the left-right direction; a controller configured to control an operation of each of the main transfer mechanisms such that one of an upper processing block configured with the first upper processing block and the second upper processing block and a lower processing block configured with the first lower processing block and the second lower processing block forms an outward path through which the substrate is transferred from the carrier block to the relay block and the other one of the upper processing block and the lower processing block forms a return path through which the substrate is transferred from the relay block to the carrier block; and a bypass transfer mechanism that is provided for each of the first processing block and the second processing block in a bypass transfer path forming block, which is one of the upper processing block and the lower processing block, and is configured to operate to form the outward path or the return path together with the main transfer mechanism of the bypass transfer path forming block, wherein, with respect to the bypass transfer path forming block, the bypass transfer mechanism is further configured to cause the substrate to be transferred to a downstream-side block by one of the main transfer mechanism of the first processing block and the main transfer mechanism of the second processing block.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 2:
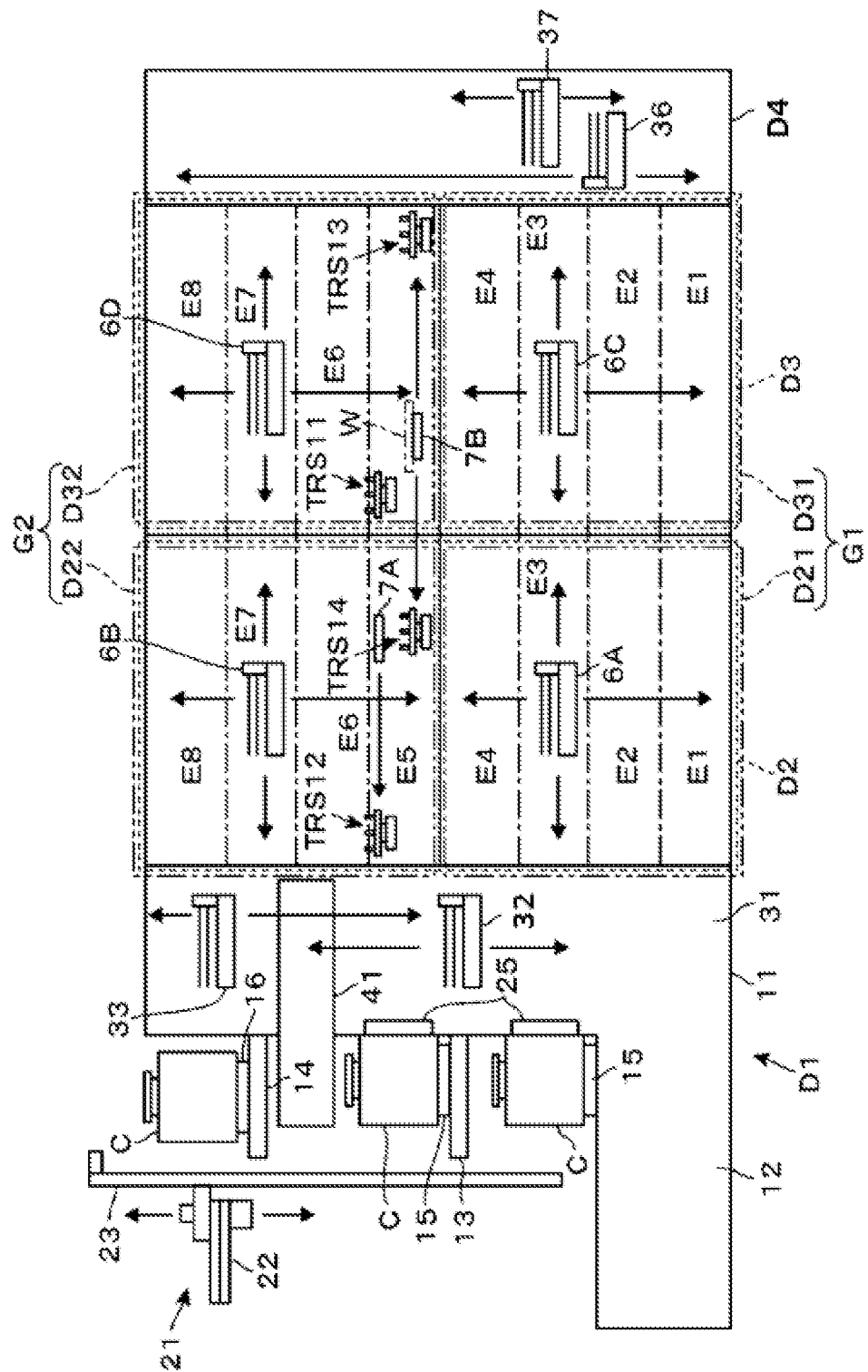
FIG. 2 is a vertical sectional front view of the substrate processing apparatus.
Figure 3:
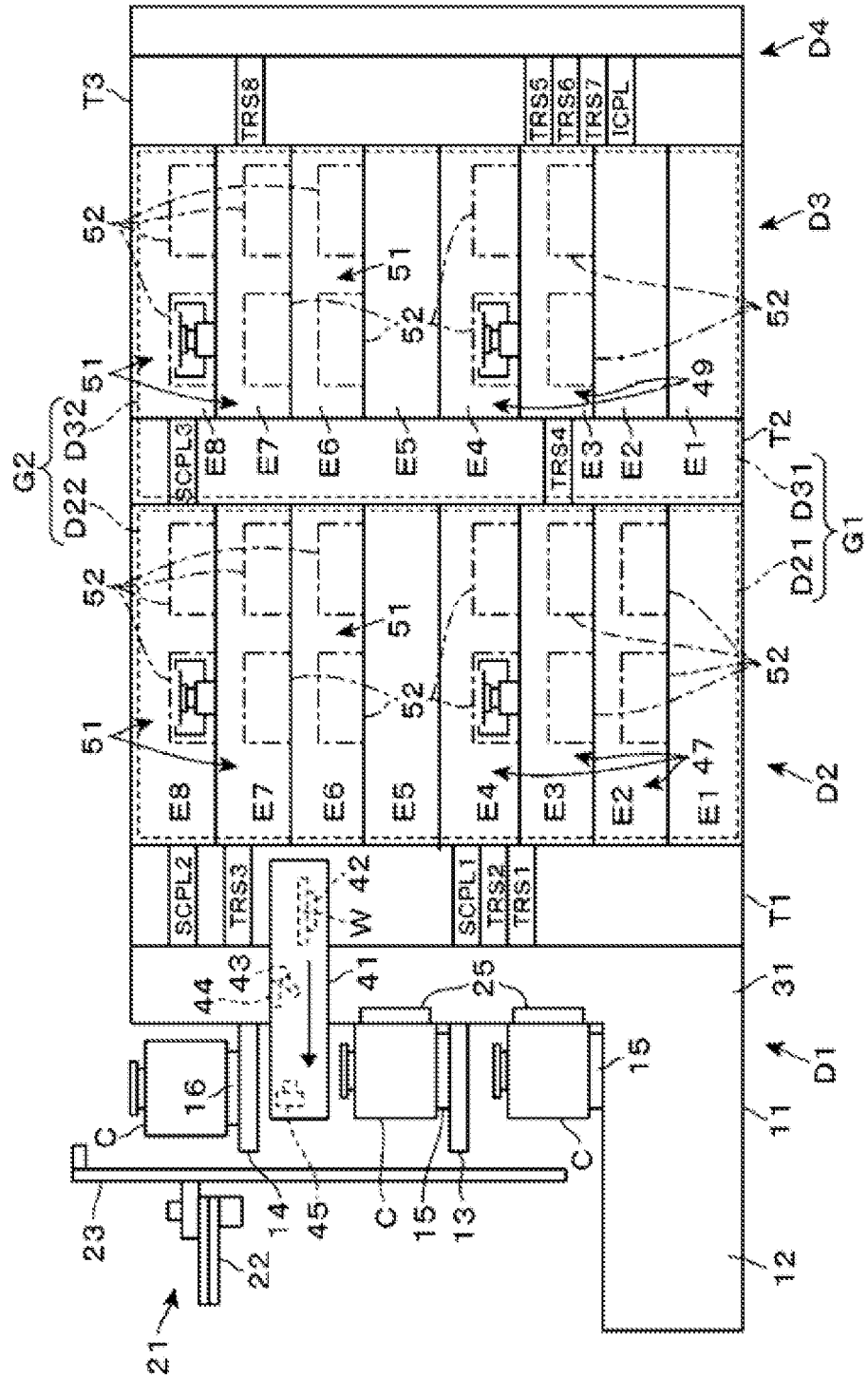
FIG. 3 is a vertical sectional front view of the substrate processing apparatus.

A substrate processing apparatus 1 according to a first embodiment of the present disclosure will be described with reference to each of a horizontal sectional plan view of FIG. 1 and vertical sectional front views of FIGS. 2 and 3. FIGS. 2 and 3 illustrate cross sections of the substrate processing apparatus 1 at different positions. In the substrate processing apparatus 1, a carrier block D1, a first processing block D2, a second processing block D3, and an interface block D4 are linearly arranged in this order in the lateral direction, and adjacent blocks are connected to each other. These blocks (the carrier block, the first and second processing blocks, and the interface block) D1 to D4 include housings, respectively, to be partitioned from each other, and a transfer region for transferring a wafer W, which is a substrate, is formed inside each housing.

In the following description, the arrangement direction of these blocks D1 to D4 will be referred to as the left-right direction, the side of the carrier block D1 will be referred to as the left side, and the side of the interface block D4 will be referred to as the right side. In addition, with respect to the anteroposterior direction of the apparatus, the front side when the carrier block D1 is viewed as the left will be referred to as the front side and the deep side will be referred to as the rear side. An exposure machine 20 is connected to the interface block D4, which is a relay block, from the right side. Due to such an arrangement, the interface block D4 is adjacent to the second processing block D3 on the side opposite to the side adjacent to the first processing block D2 in the left-right direction.

Before describing each of the blocks D1 to D4 in detail, a schematic configuration of the substrate processing apparatus 1 will be described. The wafer W is transferred to the substrate processing apparatus 1 in the state of being stored in a carrier C called, for example, a front opening unify pod (FOUP), and a resist film is formed on the surface of the wafer W. The substrate processing apparatus 1 includes processing modules that perform various types of processes such as a cleaning process and a developing process which are liquid treatments, and a heating process of a wafer W after exposure and before a developing process (post exposure bake (PEB)). In addition, before performing the PEB, the wafer W is delivered to the exposure machine 20 in order to expose the resist film.

The first processing block D2 and the second processing block D3 are each partitioned so as to be divided into two in the vertical direction. The lower side and the upper side of the first processing block D2 that are partitioned from each other will be referred to as a first lower processing block D21 and a first upper processing block D22, respectively. In addition, the lower side and the upper side of the second processing block D3 that are partitioned from each other will be referred to as a second lower processing block D31 and a second upper processing block D32, respectively. Therefore, the first lower processing block D21 and the first upper processing block D22 are stacked one above another, and the second lower processing block D31 and the second upper processing block D32 are stacked one above another. Then, the first lower processing block D21 and the first upper processing block D22 are adjacent to each other, and the second lower processing block D31 and the second upper processing block D32 are adjacent to each other.

Each of these processing blocks D21, D22, D31, and D32 includes the above-described processing modules and a transfer mechanism (a main transfer mechanism) that is capable of performing the delivery of the wafer W to the processing modules. In addition, each of the first upper processing block D22 and the second upper processing block D32 is provided with a transfer mechanism separate from the transfer mechanism that performs the delivery of the wafer W to the processing modules as described above. The separate transfer mechanism will be described below as a shuttle. This shuttle is a bypass transfer mechanism that transfers the wafer W toward a downstream-side block so as not to pass through a processing module, and the first upper processing block D22 and the second upper processing block D32 provided with the shuttle are bypass transfer path forming blocks.

The first lower processing block D21 and the second lower processing block D31 form an outward path for transferring the wafer W from the carrier block D1 to the interface block D4. In the first upper processing block D22 and the second upper processing block D32, a return path for transferring the wafer W exposed by the exposure machine 20 from the interface block D4 to the carrier block D1 is formed, and the same type of processing modules are provided so that the same process can be performed. In the return path, the wafer W is transferred to a processing module by the transfer mechanism in one of the first upper processing block D22 and the second upper processing block D32 to be subjected to a process, and is transferred by the shuttle in the other block.

The first lower processing block D21 and the second lower processing block D31 forming the outward path may be collectively described as a lower processing block G1, and the first upper processing block D22 and the second upper processing block D32 forming the return path may be collectively described as an upper processing block G2. By providing the shuttles as described above, the wafer W is transferred by one of the two transfer paths in the upper processing block G2. A module is a place on which the wafer W is placed other than a transfer mechanism (including a shuttle). A module that performs a process on the wafer W will be described as a processing module as described above, and this process also includes acquiring an image for inspection.

Figure 4:
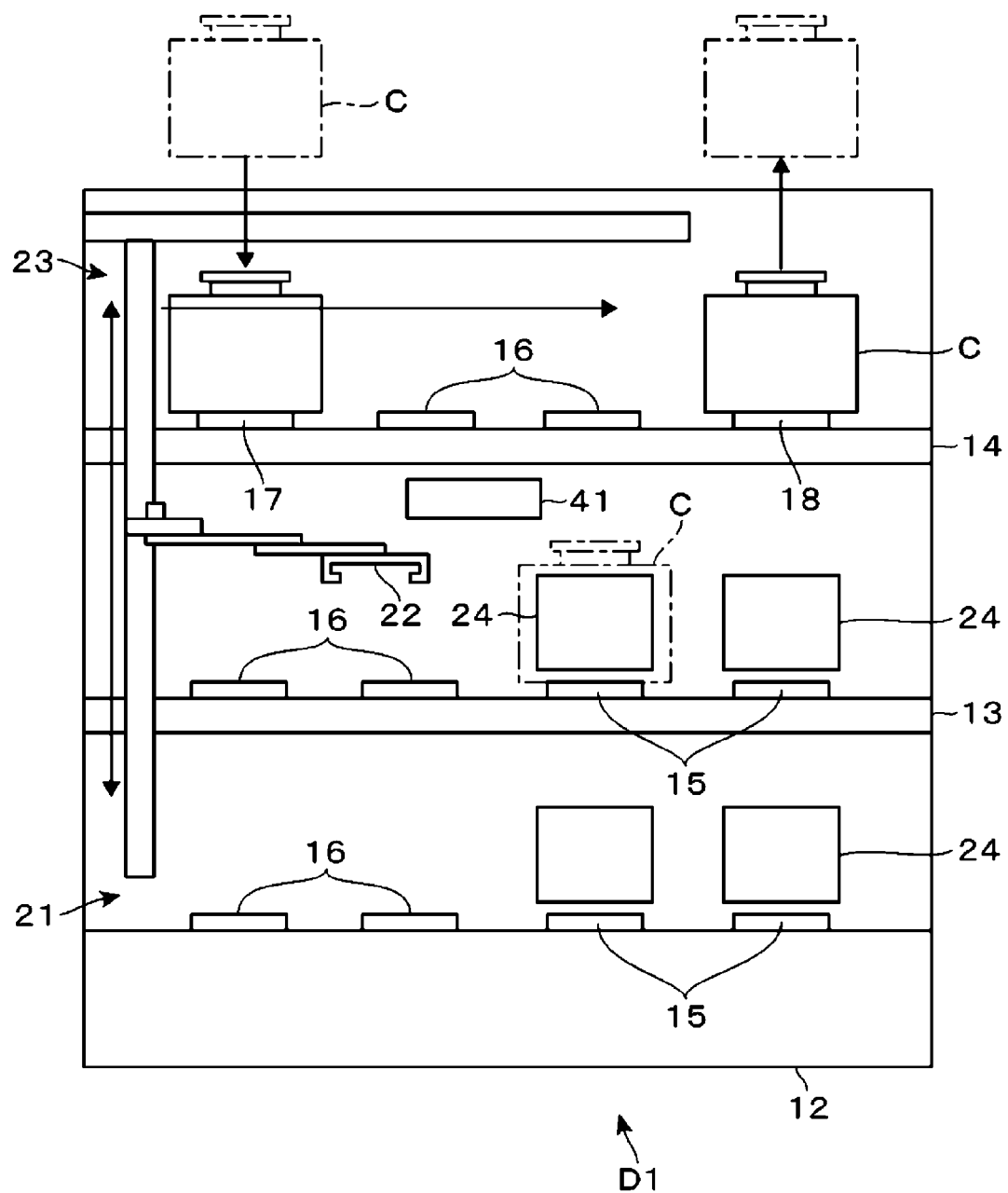
FIG. 4 is a left side view of the substrate processing apparatus.

Hereinafter, the carrier block D1 will be described with reference to the side view of FIG. 4 as well. The carrier C is carried into and out of the carrier block D1 by a carrier transfer mechanism (an external transfer mechanism) (not illustrated) provided in a clean room in which the substrate processing apparatus 1 is installed. The carrier block D1 is a block in which the loading/unloading of the wafer W is performed with respect to the carrier C.

The above-mentioned housing forming the carrier block D1 will be denoted by reference numeral 11. The housing 11 is formed in a square shape, and the lower side thereof protrudes to the left to form a support base 12. In addition, on the left side surface of the housing 11 at the upper side of the support base 12, two places spaced apart from each other in the vertical direction protrude leftward to form support bases 13 and 14, respectively. The lower support base and the upper support base will be denoted by reference numerals 13 and 14, respectively.

For example, it is possible to place four carriers C on each of the support bases 12 to 14 at intervals in the anteroposterior direction, each of the support bases is provided with stages on each of which the carrier C is placed in this manner. The stages are arranged in, for example, a 3×4 matrix form when viewed from the left. The left end portion of the support base 12 protrudes to the left of the support bases 13 and 14, and the stages of the support base 12 are provided at the right side of the support base 12 and below the support bases 13 and 14. As described above, the interior of the support base 12 is a region that stores bottles in which processing liquids for liquid processing in the first processing block D2 and the second processing block D3 are stored.

The carriers C can be transferred between respective stages by a carrier transfer mechanism 21 to be described later. Each of the stages will be now described. Two stages at the front side of the support bases 13 and 14 are configured as moving stages 15 on which the carriers C are placed in order to perform the loading/unloading of the wafer W with respect to the apparatus. Therefore, the moving stages 15 are arranged in a two-by-two matrix form when viewed from the left. The moving stages 15 move between a load position at the right side for performing the loading/unloading of the wafer W and an unload position at the left side for performing the delivery of the carrier C to/from the carrier transfer mechanism 21. In this example, the uses of the moving stages are distinguished as follows: the moving stages 15 of the support base 12 are used as stages (loaders) on which carriers C are placed, respectively, in order to dispense unprocessed wafers W into the apparatus, and the moving stages 15 of the support base 13 are used as stages (unloaders) on which carriers C are placed, respectively, in order to store wafers W processed in the apparatus. However, one moving stage 15 may be used as both a loader and an unloader.

Other stages will be now described. Two stages at the rear sides of the support bases 13 and 14 and two stages on the support base 14 are configured as temporary placement stages 16. In addition, the other two stages on the support base 14 are configured as a loading stage 17 and an unloading stage 18, respectively. For example, a rear-end-side stage and front-end-side stage of the support base 14 are the loading stage 17 and the unloading stage 18, respectively. The loading stage 17 and the unloading stage 18 are stages on which the carriers C are placed when the above-described external transfer mechanism performs the loading and unloading of respective carriers C into and from the substrate processing apparatus 1.

The carriers C are transferred in the order of the loading stage 17, the moving stage 15 of the support base 12, the moving stage 15 of the support base 13, and the unloading stage 18. In transferring the carrier C among the respective stages in this way, when a transfer destination stage is not empty (when the stage is occupied by another carrier C), the carrier C is placed on the temporary placement stage 16 and stands by until the transfer destination stage becomes empty.

A carrier transfer mechanism 21 is provided above the left side of the support base 12. The carrier transfer mechanism 21 includes an articulated arm 22 capable of holding a held portion provided on the upper portion of each carrier C, and a moving mechanism 23 movable the articulated arm 22 in the vertical direction and the anteroposterior direction. The carrier transfer mechanism 21 is capable of transferring the carrier C among the stages as described above.

Transfer ports 24 through which the loading/unloading of the wafer W is performed are formed in the left wall of the housing 11 and are arranged in a two-by-two matrix form in conformity to the arrangement of the moving stages 15 described above. A door 25 is provided at each transfer port 24. The door 25 is capable of holding the lid of the carrier C on the moving stage 15 at the loading position and movable in the state of holding the lid to open/close the transfer port 24.

The transfer port 24 faces a transfer region 31 for transferring the wafer W. The transfer region 31 is formed in the housing 11 in a straight-line shape that is long in the anteroposterior direction in a plan view. A transfer mechanism 32 is provided at the front side of the transfer region 31. The transfer mechanism 32 includes a base that is movable in the anteroposterior direction, capable of being raised and lowered, capable of being rotated around a vertical axis, and a wafer holder that is movable in the anteroposterior direction on the base. The transfer mechanism 32 is capable of accessing the carrier C on the moving stage 15 at the load position described above, and a module-stacked body T1 and a pre-processing inspection module 41 (both to be described later), thus performing the delivery of the wafer W.

The carrier block D1 is provided with the pre-processing inspection module 41. The pre-processing inspection module 41 captures an image of the surface of the wafer W before being processed by the substrate processing apparatus 1. Image data obtained by the capturing is transmitted to a controller 10 to be described later. The controller 10 determines whether or not an abnormality occurs in the wafer W based on the image data. The pre-processing inspection module 41 is configured in a flat rectangular parallelepiped shape that is elongated in the left-right direction. The right side of the pre-processing inspection module 41 is located in the central portion in the anteroposterior direction of the transfer region 31, and the left side thereof penetrates the left wall of the housing 11 and protrudes outward of the housing 11.

The pre-processing inspection module 41 includes a stage 42 movable in the left-right direction inside the module, a half mirror 43 provided above the moving path of the stage 42, an illumination part 44 configured to emit light downward via the half mirror 43, and a camera 45 provided at the left side of the half mirror 43 (see FIG. 3). The wafer W is delivered to the stage 42 located on the right side in the module by the transfer mechanism 32. While the stage 42 on which the wafer W has been delivered moves to the left and passes under the half mirror 43, light is emitted to the stage 42 by the illumination part 44 and an image of the wafer W reflected on the half mirror 43 is captured by the camera 45. In this manner, the above-mentioned image data is acquired.

Figure 1:
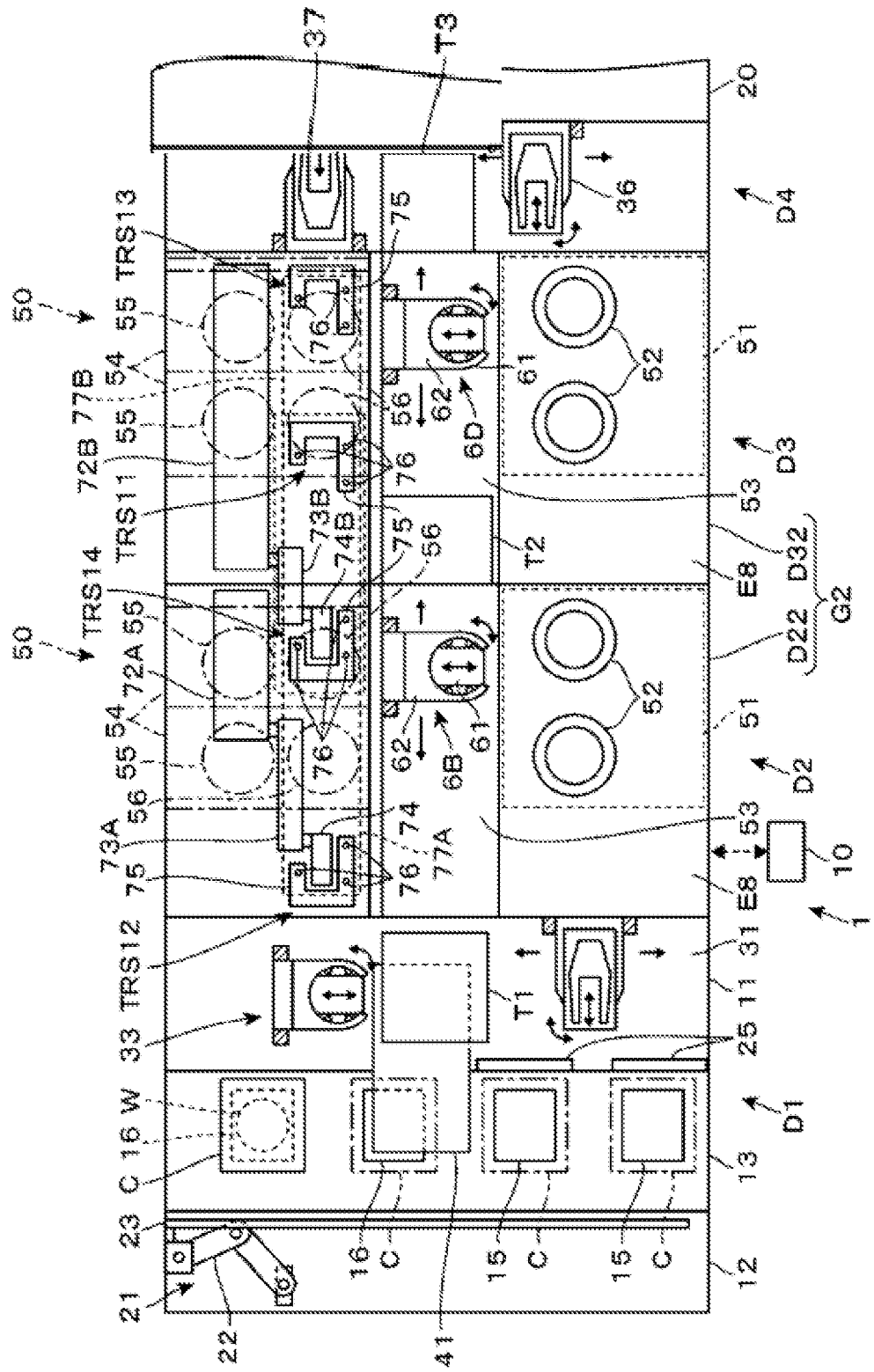
FIG. 1 is a horizontal sectional plan view of a substrate processing apparatus according to a first embodiment of the present disclosure.

As illustrated in FIG. 1, in the transfer region 31, a transfer mechanism 33 is provided to be located behind the pre-processing inspection module 41 in a plan view. The transfer mechanism 33 includes a base that is movable upward and downward and is rotatable around a vertical axis, and a wafer holder that is movable in the anteroposterior direction on the base to deliver the wafer W to the module-stacked body T1 and a TRS12 for a shuttle in the first upper processing block D22 to be described later.

Next, the module-stacked body T1 will be described. The module-stacked body T1 is configured such that a delivery module TRS on which the wafer W is temporarily placed, and a temperature adjustment module SCPL are vertically overlapped with each other, and is provided in the central portion of the transfer region 31 in the anteroposterior direction. Therefore, the module-stacked body T1 is sandwiched between the transfer mechanisms 32 and 33 in the anteroposterior direction in a plan view and is disposed to overlap the right side of the pre-processing inspection module 41. Regarding the carrier stages described above, two vertical rows of front stages including the moving stages 15 are arranged at the front side of the module-stacked body T1. Regarding two vertical rows of rear stages, one row is located at the left of the module-stacked body T1, and the other row is located behind the module-stacked body T1.

The delivery module TRS is provided with, for example, a plurality of pins arranged in the lateral direction, and delivers the wafer W to the pins by the raising/lowering operation of the transfer mechanism. The SCPL has a configuration in which a coolant flow path is connected to, for example, a plate configured to place the wafer W thereon so that the placed wafer W is cooled. The wafer W is delivered to the plate through the raising/lowering operation of the transfer mechanism. The SCPL is also provided in a block other than the carrier block D1, and the SCPL in the block other than the carrier block D1 has the same configuration as, for example, the SCPL in the carrier block D1. These TRSes are also provided in blocks other than the carrier block DE These TRSes have the same configuration as the TRSes of the carrier block D1 except for the shuttle-purpose TRSes that deliver the wafer W to and from the shuttle to be described later. Hereinafter, in order to distinguish SCPLs and TRSes at respective locations from each other, numbers are added after SCPL and TRS. In addition, a plurality of TRSes and SCPLs are provided in a stacked manner at respective locations. That is, a plurality of TRSes and SCPLs having the same number are provided, but only one is illustrated for convenience of illustration. In the present specification, the term "stacked-module body" means modules provided to overlap each other in a plan view, and the modules may be spaced apart from each other or may be in contact with each other.

Some of the modules forming the module-stacked body T1 are provided under the pre-processing inspection module 41 and the others are provided above the pre-processing inspection module 41. For example, a TRS1, a TRS2, an SCPL1, a TRS3, and an SCPL2 are provided in this order from the lower side to the upper side, and the pre-processing inspection module 41 is located between the SCPL1 and the TRS3 (see FIG. 3). For example, each of the TRS1, the TRS2, and the SCPL1 is located at the height of a first lower processing block D21, and each of the TRS3 and the SCPL2 is located at the height of the first upper processing block D22. The transfer mechanism 33 is capable of accessing each of the modules constituting the module-stacked body T1, and the transfer mechanism 32 is capable of accessing the TRS1 and the TRS2.

The TRS1 and the TRS2 are used for delivering the wafer W between the transfer mechanisms 32 and 33. The SCPL1 is used for delivering the wafer W between the first lower processing block D21 and the carrier block D1. Therefore, a transfer mechanism 6A of the first lower processing block D21, which will be described later, is also accessible to the SCPL1. In addition, the TRS3 is used for delivering the wafer W between the first upper processing block D22 and the carrier block D1. Therefore, a transfer mechanism 6B of the first upper processing block D22, which will be described later, is also accessible to the TRS3. The SCPL2 is a module for adjusting the temperature of the wafer W before being subjected to a developing process in the first upper processing block D22 and is accessed by the transfer mechanism 6B.

Figure 5:
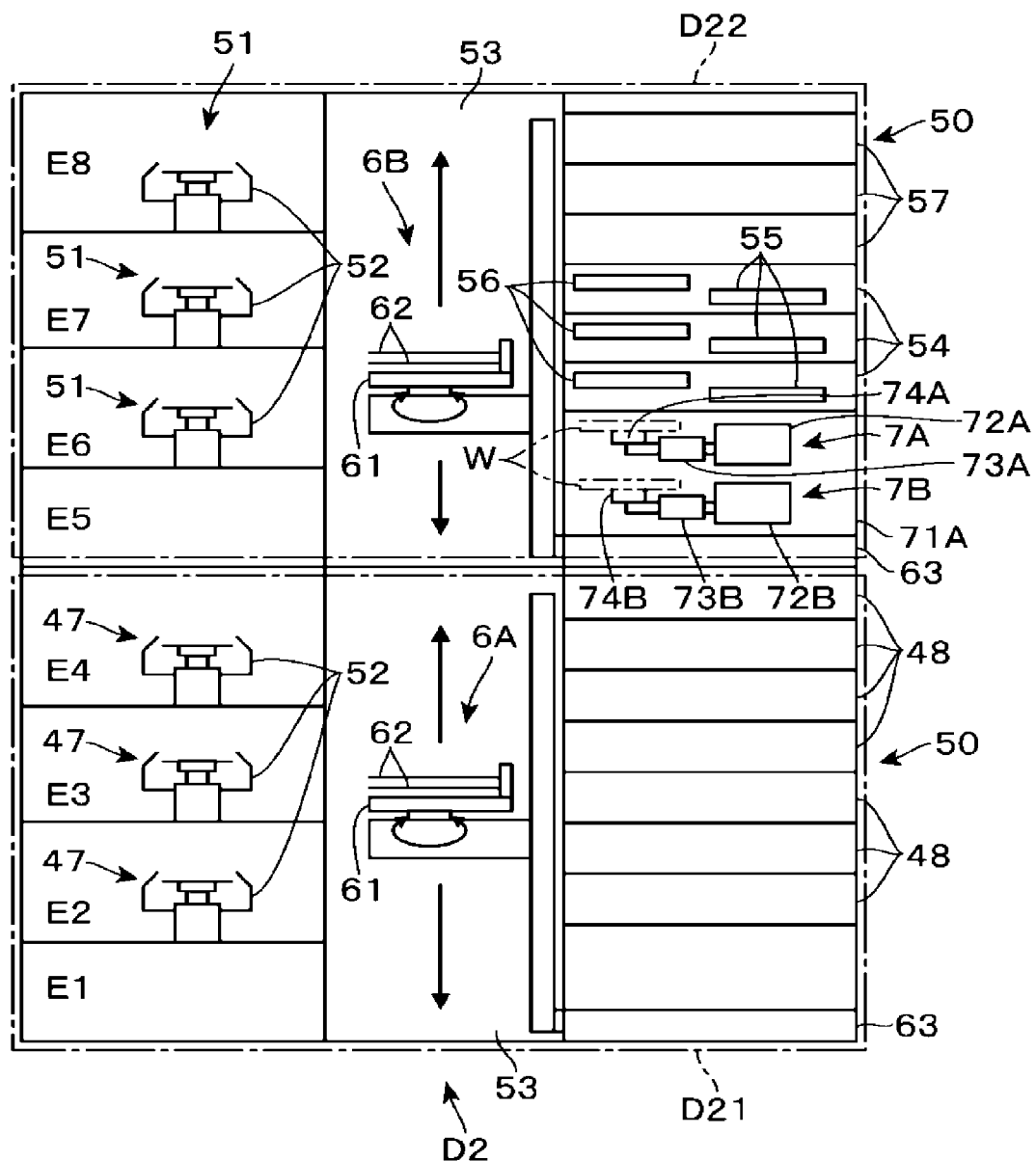
FIG. 5 is a vertical sectional side view of the substrate processing apparatus.

Next, the first processing block D2 will be described with reference to FIG. 5, which is a vertical sectional side view. The front side of the first processing block D2 is divided in the vertical direction to form eight layers, and respective layers are denoted by reference numerals E1 to E8 from the lower side to the upper side. The lower layers E1 to E4 and the upper layers E5 to E8 are included in the first lower processing block D21 and the first upper processing block D22, respectively. Each layer forms a region in which a liquid processing module can be installed.

First, the first upper processing block D22 will be described. In each of the layers E5 to E8, a developing module 51 is provided as a liquid processing module. The developing module 51 includes two cups 52 arranged in the left and right sides and each accommodating the wafer W, and a nozzle (not illustrated), and is configured to supply a developer, which is supplied from the above-described bottle by a pump (not illustrated), to the surface of the wafer W to perform a process.

A wafer transfer region 53 is provided at the rear side of the layers E5 to E8 and is formed in a straight-line shape in a plan view from the left end to the right end of the upper processing block D22. Therefore, the extension direction of the transfer region 53 is orthogonal to the extension direction of the transfer region 31 in the carrier block D1. The transfer region 53 is formed from the height of the layer E5 to the height of the layer E8. That is, the transfer region 53 is not partitioned by each of the layers E5 to E8.

Behind the transfer region 53, for example, processing modules are provided to be stacked in seven stages in the vertical direction, and two processing module-stacked bodies are arranged side by side in the left-right direction. That is, each of the processing module-stacked bodies and the cups 52 is provided along the extension direction of the transfer region 53.

The processing module-stacked bodies arranged in the left-right direction will be referred to as rear processing parts 50. As processing modules constituting the rear processing units 50, a plurality of heating modules 54 and a plurality of post-processing inspection modules 57 are provided. Each of the heating modules 54 is a module for performing the above-described PEB and includes a hot plates 55 that heats the wafer W placed thereon and a cooling plate 56 that adjusts the temperature of the wafer W. The cooling plate 56 is movable between a front position at which the wafer W is delivered through the elevating operation of the transfer mechanism 6B to be described later and a rear position at which the cooling plate 56 overlaps the hot plate 55. The wafer W is delivered between the hot plate 55 and the cooling plate 56 in the cooperation between the lifting operation of pins (not illustrated) included in the hot plate 55 and the above-mentioned movement of the cooling plate 56.

The post-processing inspection module 57 has the same configuration as the pre-processing inspection module 41 and is arranged such that the moving direction of the wafer W at the time of capturing becomes the anteroposterior direction. The post-processing inspection module 57 acquires image data of the surface of the wafer W processed by the substrate processing apparatus 1, more specifically, the surface of the wafer W on which a resist pattern is formed through development, and transmits the image data to the controller 10.

The transfer region 53, which is a main transfer path, is provided with the transfer mechanism 6B, which is a main transfer mechanism described above. The transfer mechanism 6B includes a base 61 that is movable leftward and rightward, movable upward and downward, and rotatable around a vertical axis, and the wafer holder 62 that is extendible on the base 61. In the substrate processing apparatus 1 including the transfer mechanism 6B, each transfer mechanism is provided with two holders other than the shuttle, and the holders are movable in the anteroposterior direction on the base independently of each other.

A moving mechanism 63 for moving the base 61 of the transfer mechanism 6B in the left-right direction is provided below the rear processing part 50. A flat space 71A is formed between the moving mechanism 63 and the rear processing part 50. The flat space 71A is formed from the left end to the right end of the first upper processing block D22. Further, shuttles and a TRS12 and a TRS14 for the shuttles are installed in the flat space 71A, which will be described in detail later. The transfer mechanism 6B is capable of delivering the wafer W to each processing module in the first upper processing block D22, the TRS3 and the SCPL2 in the carrier block D1, and the TRS14 for the shuttle. That is, the transfer mechanism 6B is shared with each of the liquid processing modules provided in the plurality of stacked layers.

Next, the first lower processing block D21 will be described. The first lower processing block D21 has substantially the same configuration as the above-described first upper processing block D22, and differences from the first upper processing block D22 will be mainly described below. The layer E1 is not provided with a processing module, and the layers E2 to E4 are each provided with a rear surface cleaning module 47, as a liquid processing module. The rear surface cleaning module 47 has the same configuration as the developing module 51, except that a nozzle for supplying a cleaning liquid to the rear surface of the wafer W is provided instead of being provided with a nozzle for supplying a developer to the front surface of the wafer W.

As a processing module constituting the rear processing part 50, a peripheral edge exposure module 48 is included to remove an unnecessary resist film on the peripheral edge of the wafer W at the time of development. The main transfer mechanism provided in the transfer region 53 is illustrated as the transfer mechanism 6A and has the same configuration as the transfer mechanism 6B described above. The transfer mechanism 6A delivers the wafer W to each processing module in the first lower processing block D21, the SCPL1 in the module-stacked body T1 described above, and a module-stacked body T2 to be described later. The first lower processing block D21 is not provided with a shuttle and a TRS for the shuttle.

Next, the second processing block D3 will be described. The second processing block D3 has substantially the same configuration as the first processing block D2, and differences from the first processing block D2 will be mainly described below. First, an example of a difference between the second upper processing block D32 and the first upper processing block D22 is that the second upper processing block D32 is provided with an SCPL3 constituting the module-stacked body T2 at the left end in the transfer region 53 (see FIG. 3). The SCPL3 is a module for adjusting the temperature of the wafer W before the developing process in the second upper processing block D32.

The main transfer mechanism in the second upper processing block D32 will be denoted by reference numeral 6D. A space 71B similar to the flat space 71A of the first upper processing block D22 is also formed between the moving mechanism 63 for moving the transfer mechanism 6D and the rear processing part 50. The space 71B is located at the same height as the flat space 71A and communicates with the flat space 71A. Shuttles and a TRS11 and a TRS13 for the shuttles are installed in the space 71B, which will be described later. The transfer mechanism 6D delivers the wafer W to each processing module in the upper processing block D22, a module-stacked body T3 of the interface block D4 to be described later, and the TRS11 for the shuttle.

A layout of modules in the second upper processing block D32 will be additionally described. Each of the rear processing parts 50 and the cups 52 of the developing modules 51 are located on the right side of the stacked-module body T2 such that they can be delivered by the transfer mechanism 6D. The layout of the liquid processing module and the rear processing part 50 is common between the first and second lower processing blocks D21 and D31, and between the first and second upper processing blocks D22 and D32. Therefore, even in the above-described first lower processing block D21 and first upper processing block D22, the rear processing parts 50 and the cups 52 of the liquid processing modules are provided at positions spaced apart from the left ends of the blocks.

Next, the second lower processing block D31 will be described. A TRS4 constituting the module-stacked body T2 together with the SCPL2 is provided at the left end of the transfer region 53 (see FIG. 3). The layers E1 and E2 are not provided with a liquid treatment module, and the layers E3 and E4 are each provided with a post-exposure cleaning module 49 for cleaning the front surface of the wafer W after exposure by the exposure machine 20. The post-exposure cleaning module 49 has the same configuration as the developing module 51, except that the processing liquid supplied to the wafer W is a cleaning liquid instead of the developer. In the second lower processing block D31, a process other than the cleaning is not performed, and thus the rear processing part 50 is not provided behind the transfer region 53.

The main transfer mechanism in the second lower processing block D31 will be referred to as a transfer mechanism 6C. The transfer mechanism 6C delivers the wafer W to each processing module in the lower processing block D21 and the module-stacked body T3 of the interface block D4 to be described later.

Next, the interface block D4 will be described. The interface block D4 includes the module-stacked body T3 in the central portion in the anteroposterior direction. The module-stacked body T3 includes a TRS5, a TRS6, a TRS7 and a TRS8 which are stacked one above another, and a temperature control module ICPL. In addition to these, for example, a buffer module for temporally making the wafer W stand by is provided, but a description thereof will be omitted. The ICPL is a module to which the wafer W is transferred immediately before the exposure by the exposure machine 20. Similarly to the SCPL, the ICPL adjusts the temperature of the wafer W placed thereon. The TRS5, the TRS6, and the TRS7 are provided at the height of the lower processing block G1, and the TRS8 is provided at the height of the upper processing block G2. Transfer mechanisms 36 and 37 are provided at the front and rear sides of the module-stacked body T3, respectively.

The transfer mechanism 36 is similar in configuration to the transfer mechanism 32 of the carrier block D1, and delivers the wafer W among the exposure machine 20, the TRS6, and the ICPL located near the underside of the module-stacked body T3. The transfer mechanism 37, which is a lifting and transferring mechanism, is similar in configuration to the transfer mechanism 38 of the carrier block D1, and delivers the wafer W to each module constituting the module-stacked body T3 and the TRS13 for the shuttle in the second upper processing block D32.

Next, the shuttles provided in the first upper processing block D22 and the second upper processing block D32 will be described with reference numerals 7A and 7B, respectively. The shuttle 7A, which is a first bypass transfer mechanism, includes a moving mechanism 72A, a moving body 73A, and a support 74A. The moving mechanism 72A is configured as a long member extending in the left-right direction and is provided to be accommodated in the flat space 71A of the first upper processing block D22 described above. The moving body 73A is connected to the front side of the moving mechanism 72A and extends in the left-right direction. The support 74A is connected to the front side of the moving body 73A, and is formed in a rectangular parallelepiped shape elongated in the left-right direction. The wafer W is supported on the support 74A and is transferred horizontally linearly in the left-right direction.

By the moving mechanism 72A, the moving body 73A is movable in the left-right direction with respect to the moving mechanism 72A. With the movement of the moving body 73A with respect to the moving mechanism 72A, the support 74A moves in the left-right direction with respect to the moving body 73A (see FIGS. 6 to 8). The moving body 73A moves between a right position at which the right end of the moving body 73A is located at the right side (the side of the interface block D4) of the right end of the moving mechanism 72A and a left position at which the left end of the moving body 73A is located at the left side (the side of the carrier block D1) of the left end of the moving mechanism 72A. When the moving body 73A is located at the right position, the right end of the support 74A is in the state of being located at the right side of the right end of the moving body 73A (the state illustrated in FIG. 6). The position of the support 74A in this state will be referred to as a right transfer position. When the moving body 73A is located at the left position, the left end of the support 74A is in the state of being located at the left side of the left end of the moving body 73A (the state illustrated in FIG. 8). The position of the support 74A in this state will be referred to as a left transfer position.

The shuttle 7A transfers the wafer W from the TRS11 provided in the second upper processing block D32 to the TRS12 provided in the first upper processing block D22. The TRS11 will be described later. The TRS11 includes a support plate 75 constituting a placement part main body formed to have a recess in which the left side in a plan view is opened, three pins 76 protruding upward from the support plate 75, and a lifting mechanism (not illustrated) configured to move the support plate 75 upward and downward. The lifting mechanism may be an actuator such as a cylinder or a motor. The lifting mechanism is connected to the rear side (the lower side) of each support plate 75 and is provided at a position that does not interfere with the moving trajectory of the moving body 73A or the support 74A. By moving the support plate 75 upward and downward, the pins 76 move between a raised position and a lowered position to support the bottom surface of the wafer W. The right end portion of the support 74A at the right transfer position is in the state of being accommodated in the recess formed in the support plate 75 in a plan view so that the wafer W can be delivered between the support 74A and the TRS11 when the pins 76 move upward and downward. The TRS11 is provided on the right side of the module-stacked body T2 such that the wafer W can be delivered to and from the transfer mechanism 6B as well (see FIG. 1).

The TRS12 has the same configuration as the TRS11 except that the support plate 75 is formed to have the recess in which the right side in a plan view is opened. The left end portion of the support 74A at the left transfer position is in the state of being accommodated in the recess formed in the support plate 75 in a plan view so that the wafer W can be delivered between the support 74A and the TRS12. The TRS12 is provided at the left end portion of the first upper processing block D22 such that the wafer W can be delivered to and from the transfer mechanism 33 of the carrier block D1. In view of the foregoing, it can be said that the transfer of the substrate (the wafer W) supported on the support 74 is performed while a plurality of members such as the moving body 73A and the support 74A provided in the anteroposterior direction change relative positions thereof in the left-right direction. By transferring the substrate in this way, the TRS11 and the TRS12 located in the left-right direction with respect to the support 74A are less likely to interfere with the moving body 73A, which makes it possible to arrange the pins 76 at three or more positions at which the substrate can be easily supported.

The shuttle 7B, which is a second bypass transfer mechanism, is provided at a height different from that of the shuttle 7A, and is located, for example, below the shuttle 7A. The shuttle 7B is similar in configuration to the shuttle 7A. Respective reference numerals of the moving mechanism, the moving body, and the support, which are constituent elements of the shuttle 7B, will be indicated by adding B instead of A after the numbers so as to distinguish them from those of the shuttle 7A. Specifically, for example, the moving mechanism of the shuttle 7B is denoted by reference numeral 72B. The moving mechanism 72B is provided to be accommodated in the space 71B of the second upper processing block D32.

The shuttle 7B transfers the wafer W from the TRS13 provided in the second upper processing block D32 to the TRS14 provided in the first upper processing block D22. The TRS13 has the same configuration as the TRS11, and is provided at the right end portion of the second upper processing block D32 so that the wafer W can be delivered to and from the interface block D4. The TRS14 has the same configuration as the TRS12 and only needs to deliver the wafer W to and from the transfer mechanism 6B. For example, the TRS14 is provided at the right end portion of the first upper processing block D22.

Since the shuttle 7B is provided below the shuttle 7A as described above, the height at which the TRS13 and TRS14, which are the second bypass substrate placement parts, are located is lower than the height at which the TRS11 and TRS12, which are the first bypass substrate placement parts, are located. That is, as illustrated in FIG. 2, a set of the shuttle 7A, the TRS11, and the TRS12, and a set of the shuttle 7B, the TRS13, and the TRS14 are provided at positions deviated from each other in the vertical direction.

Assuming that a wafer transfer path (a first bypass transfer path) of the wafer W by the shuttle 7A and a wafer transfer path (a second bypass transfer path) of the wafer W by the shuttle 7B are denoted by reference numerals by 77A and 77B, respectively, the front and rear positions of these transfer paths 77A and 77B are equal to each other. Corresponding to the positions of the TRS11 to the TRS14 described above, the transfer path 77A protrudes toward the second upper processing block D32, and the transfer path 77B protrudes toward the first upper processing block D22. Such a protrusion allows the right side of the transfer path 77A and the left side of the transfer path 77B to overlap each other in a plan view. The transfer paths 77A and 77B may be located, for example, at a position that is separated from the hot plate 55 of the heating module 54 and overlap the standby position of the cooling plate 56. By arranging the transfer path relatively away from the hot plate 55 in this way, it is possible to more reliably suppress the wafer, which is being transferred, from being affected by heat.

Figure 6:
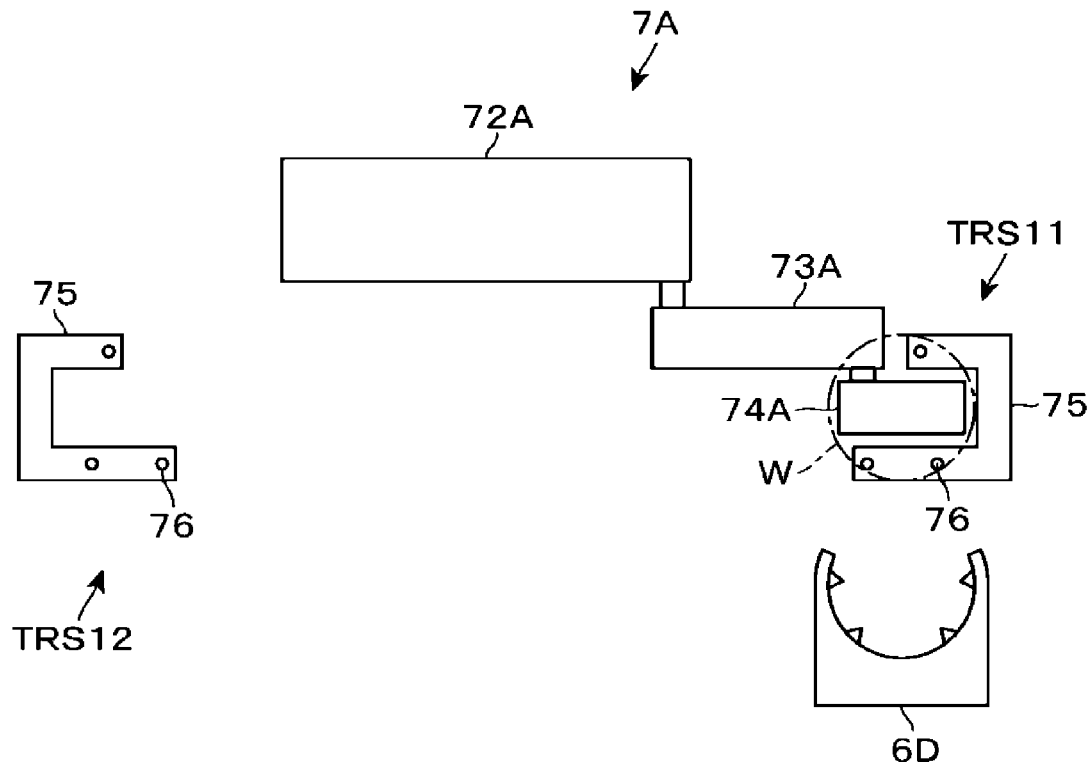
FIG. 6 is an explanatory view illustrating an operation of a transfer mechanism provided in the substrate processing apparatus.
Figure 7:
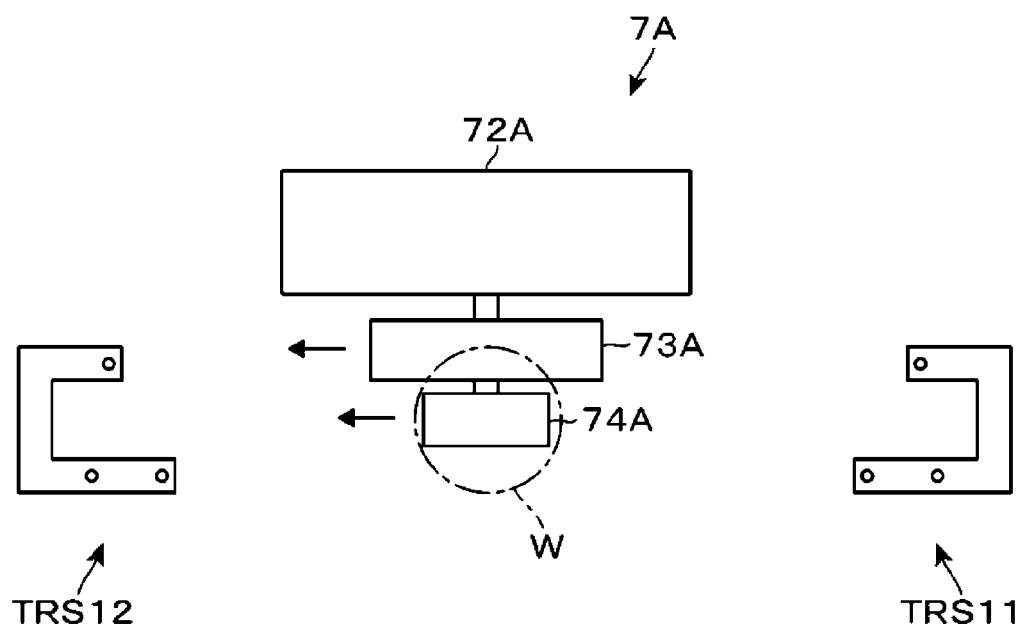
FIG. 7 is an explanatory view illustrating an operation of a transfer mechanism provided in the substrate processing apparatus.

The transfer of the wafer W by the shuttle 7A will be described step by step with reference to FIGS. 6 to 8. The transfer mechanism 6D of the second upper processing block D32 delivers the wafer W processed by each processing module in the second upper processing block D32 onto the pins 76 at the raised position of the TRS11. The pins 76 move to the lowered position, and the wafer W is delivered to the support 74A at the above-mentioned right transfer position (FIG. 6). While each of the moving body 73A and the support 74A moves leftward, the pins 76 of the TRS11 return to the raised position (FIG. 7).

Figure 8:
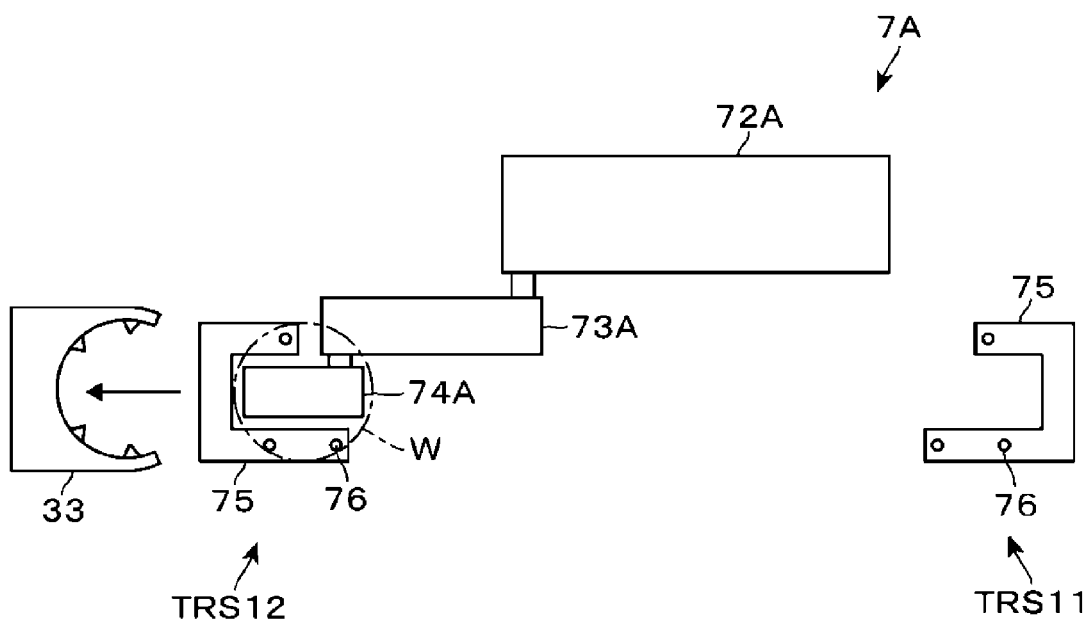
FIG. 8 is an explanatory view illustrating an operation of a transfer mechanism provided in the substrate processing apparatus.

When the support 74A moves to the left transfer position described above, the pins 76 at the lowered position of the TRS12 move to the raised position to support the wafer W (FIG. 8). When the support 74A moves toward the right transfer position, the pins 76 return to the lowered position. Thereafter, the transfer mechanism 33 of the carrier block D1 receives the wafer W. In this way, the shuttle 7A transfers the wafer W toward the carrier block D1 which is a downstream-side block. The shuttle 7B, the TRS13, and the TRS14 also operate in the same manner as the shuttle 7A, the TRS11, and the TRS12, and the wafer W is transferred from the TRS13 to the TRS14. That is, the shuttle 7B transfers the wafer W toward the first upper processing block D22, which is a downstream-side block.

In addition, the substrate processing apparatus 1 includes the controller 10 (see FIG. 1). The controller 10 is configured with a computer, and includes a program, a memory, and a CPU. The program incorporates a group of steps so as to execute a series of operations in the substrate processing apparatus 1. Based on the program, the controller 10 outputs a control signal to each part of the substrate processing apparatus 1 so as to control the operation of each part. Specifically, the operations of the transfer mechanisms 6A to 6D, the shuttles 7A and 7B, and each processing module are controlled. As a result, the transfer, processing, and the determination on the presence or absence of an abnormality in the wafer W, which will be described later, are performed. The above-mentioned program is stored in a storage medium such as a compact disc, a hard disc, or a DVD, and is installed on the controller 10.

Figure 9:
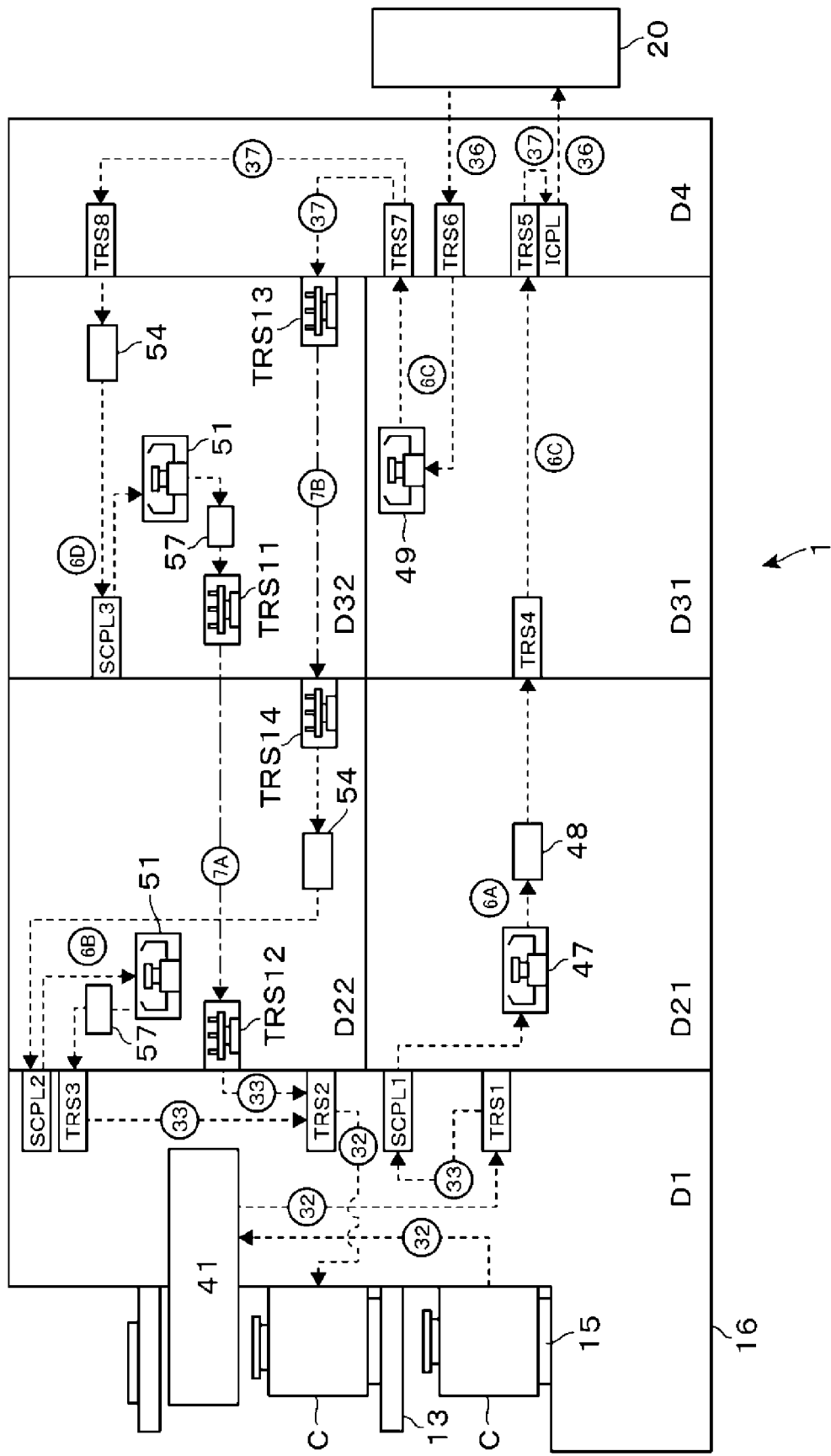
FIG. 9 is a schematic view illustrating a transfer path in the substrate processing apparatus.

Next, the processing and transfer of the wafer W in the substrate processing apparatus 1 will be described with reference to FIG. 9 which illustrates the outline of a transfer path. In FIG. 9, the transfer mechanisms used for transfer are indicated on or near some of the arrows representing the transfer of the wafer W among the modules. First, the wafer W is unloaded from the carrier C placed on the moving stage 15 of the support base 12 by the transfer mechanism 32. Then, by the transfer mechanism 32, the wafer W is transferred to the pre-processing inspection module 41 where image data is acquired to determine the presence or absence of an abnormality.

Thereafter, the wafer W is transferred to the TRS1 by the transfer mechanism 32, and is transferred to the SCPL1 by the transfer mechanism 33. Subsequently, the wafer W is introduced into the first lower processing block D21 by the transfer mechanism 6A and is transferred to the rear surface cleaning module 47 and the peripheral edge exposure module 48 in the named order where the wafer W is subjected to a process, and is then transferred to the TRS4 of the second lower processing block D31.

Subsequently, the wafer W is transferred to the TRS5 of the interface block D4 by the transfer mechanism 6C, transferred to the ICPL by the transfer mechanism 37, and then transferred to the exposure machine 20 by the transfer mechanism 36 where the resist film on the surface of the wafer W is exposed along a predetermined pattern. The exposed wafer W is transferred to the TRS6 by the transfer mechanism 36, subsequently, introduced into the lower processing block D31 again by the transfer mechanism 6C, and transferred to the post-exposure cleaning module 49. Thereafter, the wafer W is transferred to the TRS7 of the interface block D4. The transfer mechanism 37 receives the wafer W.

Subsequently, as described above, the transfer path for the wafer W is divided into a path (referred to as a first path) in which a process in the first upper processing block D22 is performed and a path (referred to as a second path) in which a process in the second upper processing block D32 is performed. The second path will be described later. The transfer mechanism 38 transfers the wafer W to the TRS8 of the module-stacked body T3, and the wafer W is introduced into the second upper processing block D32 by the transfer mechanism 6D. Then, the wafer W is transferred to the heating module 54, the SCPL3, the developing module 51, and the post-processing inspection module 57 in the named order. Thus, a resist pattern is formed on the wafer W and then image data is acquired to determine the presence or absence of an abnormality.

Thereafter, the wafer W is transferred to the transfer mechanism 6D, the TRS11, the shuttle 7A, and the TRS12 in the named order as described with reference to FIGS. 6 to 8. Thereafter, the transfer mechanism 33 of the carrier block D1 receives and transfers the wafer W to the TRS2. In this way, the wafer W is transferred to a downstream-side block by the transfer mechanism 6D of the transfer mechanisms 6B and 6D, which are the main transfer mechanisms of the first upper processing block D22 and the second upper processing block D32, which are bypass transfer path forming blocks, and the shuttle 7A. Thereafter, the wafer W is stored in the carrier C on the moving stage 15 of the support base 13 by the transfer mechanism 32.

Next, the first path will be described later. The wafer W is transferred to the transfer mechanism 38, the TRS13, the shuttle 7B, the TRS14, and the transfer mechanism 6B in the named order, and is introduced into the first upper processing block D22. Then, the wafer W is transferred by the transfer mechanism 6B to the heating module 54, the SCPLS, the developing module 51, the post-processing inspection module 57 in the named order, and is subject to the process similarly to the wafer W in the second path and then is transferred to the TRS3 of the carrier block D1. In this way, the wafer W is transferred to a downstream-side block by the transfer mechanism 6B of the transfer mechanisms 6B and 6D, which are the main transfer mechanisms of the first upper processing block D22 and the second upper processing block D32, which are bypass transfer path forming blocks, and the shuttle 7B. Subsequently, the wafer W is transferred to the TRS2 by the transfer mechanism 33, and then is transferred to the carrier C on the moving stage 15 of the support base 13 by the transfer mechanism 32, similarly to the wafer W in the second path.

In the case in which the transfer is performed while the substrate processing apparatus 1 is configured as above, it is not necessary for each of the transfer mechanism 6B of the first upper processing block D22 and the transfer mechanism 6D of the second upper processing block D32 to transfer the wafer W, which is not processed in the blocks provided with the transfer mechanisms 6B and 6D, toward the carrier block D1. That is, the load of each of the transfer mechanisms 6B and 6D, more specifically, the number of transfer steps required in the blocks is reduced. As described above, a large number of modules are provided in each of the first upper processing block D22 and the second upper processing block D32. When the load is reduced as described above, the transfer mechanisms 6B and 6D are able to quickly access to respective modules, receive wafers W, and transfer the wafers W to a downstream-side module. That is, in the substrate processing apparatus 1, the wafers W can be processed by a large number of processing modules, and the wafers W can be quickly transferred among the modules. Therefore, with the substrate processing apparatus 1, it is possible to increase throughput.

In order to make it unnecessary for the transfer mechanisms 6B and 6D to move across left and right blocks, the transfer path 77A of the shuttle 7A and the transfer path 77B of the shuttle 7B protrude to the second upper processing block D32 and the first upper processing block D22, respectively. The heights of the transfer paths 77A and 77B provided to extend across the left and right blocks are deviated from each other and do not intersect with each other so that the transfer of the shuttle 7A and the transfer of the shuttle 7B can be performed independently of each other. More specifically, during transfer by one shuttle of the shuttles 7A and 7B, it is not necessary to stop the transfer by the other shuttle in order to avoid interference with the one shuttle. Therefore, it is possible to more reliably increase the throughput of the substrate processing apparatus 1. In addition, since the transfer paths 77A and 77B having such deviated heights are provided to overlap in a plan view, it is possible to prevent the substrate processing apparatus 1 from increasing in the front-rear width and to reduce the footprint of the apparatus.

It is necessary to set the height of the substrate processing apparatus 1 such that the substrate processing apparatus 1 does not interfere with the ceiling of the clean room. The liquid processing modules such as the developing modules 51 include the cups 52 for storing wafers W and have a relatively large height. However, in the substrate processing apparatus 1, shuttles 7A and 7B are provided to overlap the rear processing part 50 that performs a process that is different from the above-described liquid processing. Therefore, in a limited height of the apparatus, it is possible to sufficiently secure the height of the transfer region 53 such that the number of layers in which liquid processing modules are provided is increased and wafers W can be delivered to each layer. Therefore, with the substrate processing apparatus 1, it is possible to increase throughput of wafers W more reliably.

In addition, the shuttles 7A and 7B are located below the rear processing part 50 in the upper processing block G2, that is, at the height of the side of the lower processing block G1. That is, with respect to the processing module-stacked body constituting the rear processing part 50, of the upper processing block G2 and the lower processing block G1, the block G1 connected from the lower side to the block G2, which is a bypass transfer path forming block, is provided with the shuttles 7A and 7B. It is assumed that the shuttles 7A and 7B are provided at relatively high positions in the upper processing block G2, and the TRS11 to the TRS14 for shuttles are also provided at relatively high positions. In that case, it is considered that it is necessary to move the transfer mechanisms 33 and 38, which deliver the wafers W to the TRS12 and the TRS13, respectively, to positions higher than the positions of respective modules forming the module-stacked bodies T1 and T3. That is, when the shuttles 7A and 7B are provided at a height on the side of the lower processing block G1 with respect to the rear processing part 50 as described above, the lifting amounts of the transfer mechanisms 33 and 38 will be suppressed. Therefore, the arrangement of the shuttles 7A and 7B contributes to increasing throughput more reliably.

In addition, regarding the TRS12 provided at the downstream side of the transfer path 77A of the shuttle 7A, when the support 74A of the shuttle 7A is located at the left transfer position at which the wafer W is delivered as illustrated in FIG. 8, the support 74A is not located at the upstream side of the transfer path 77A with respect to the pins 76 of the TRS12 in a plan view. By configuring the TRS12 and the support 74A to have such a layout, in the state in which the wafer W is still supported by the pins 76 of the TRS12, the support 74A can be directed to the TRS11 to receive a subsequent wafer W without interfering with the pins 76 of the TRS12. Since the shuttle 7B and TRS14 have the same configuration as the shuttle 7A and TRS12, respectively, in the state in which the wafer W is still supported by the pins 76 of the TRS14, the support 74A of the shuttle 7B can be directed to the TRS13 without interfering with the pins 76. Therefore, since the wafers W can be continuously and quickly transferred by the shuttles 7A and 7B, it is possible to increase throughput more reliably.

The supports 74A and 74B of the shuttles 7A and 7B are not limited to the above-described configurations. For example, the support 74A or 74B may be formed as a relatively large disk and may have a structure in which a slit formed leftward from the right end and a slit formed rightward from the left end are provided in the disk so as to avoid interference with respective pins 76 of the TRS at the upstream side and the TRS at the downstream side of the transfer path.

In the shuttle 7A, each of the moving body 73A and the support 74A slides in the left-right direction with respect to the moving mechanism 72A. With such a configuration, each of these members can be accommodated in the first processing block D2. Therefore, after assembling the first processing block D2 in an apparatus manufacturing factory, the width of the first processing block D2 in the left-right direction can be reduced when transferring the first processing block D2 to the clean room in which the apparatus is installed. Therefore, it is possible to simplify the labor and transfer equipment during transfer. Since the shuttle 7B has the same configuration as the shuttle 7A, for the second processing block D3, it is also possible to simplify the labor and transfer equipment during transfer as in the first processing block D2. Transferring the shuttles 7A and 7B in the state of being accommodated respectively in the first processing block D2 and the second processing block D3 in this way contributes to quickly assembling the apparatus to be operable at the transfer destination.

In the substrate processing apparatus 1 of the first embodiment, the liquid processing modules in the first lower processing block D21 and the second lower processing block D31 are not limited to the modules that perform cleaning. For example, a liquid processing module that performs a process in the pre-cleaning step may be equipped. Hereinafter, a coating and developing apparatus, which is a modification of the substrate processing apparatus 1 equipped with a liquid processing module other than cleaning modules as described above, will be described in detail.

In this coating and developing apparatus, an antireflection film forming module 81 is provided as a liquid processing module of the first lower processing block D21, and a resist film forming module 82 is provided as a liquid processing module of the second lower processing block D31. The antireflection film forming module 81 and the resist film forming module 82 have the same configuration as the developing module 51, except that the processing liquids supplied to the wafer W are a coating liquid for forming an antireflection film and a resist liquid, respectively. The wafer W is transferred to the coating and developing apparatus in the state in which the antireflection film and the resist film are not formed.

In this coating and developing apparatus, heating modules 54 are included as the rear processing parts 50 of the first lower processing block D21 and the second lower processing block D31. These heating modules 54 are used for removing the solvent remaining in a formed film. TRSes and SCPLs are arranged at appropriate heights and in appropriate numbers in the module-stacked bodies T1 to T3 in the coating and developing apparatus and each apparatus to be described later so that the wafers W can be appropriately transferred among the blocks.

In the coating and developing apparatus, the wafer W is transferred to the SCPL of the module-stacked body T1, the antireflection film forming module 81, and the heating module 54 of the first lower processing block D21 in the named order. In addition, the wafer W is transferred to the SCPL of the module-stacked body T2, the resist film forming module 82, the heating module 54 of the second lower processing block D31, the module-staked body T3 of the interface block D4, and the exposure machine 20 in the named order. The exposed wafer W is transferred along the same path as that in the substrate processing apparatus 1. The rear surface cleaning module 47 and the post-exposure cleaning module 49 may be provided in the interface block D4 and may be transferred by the transfer mechanism 38, or the processes by these modules may be omitted.

Second Embodiment

Figure 10:
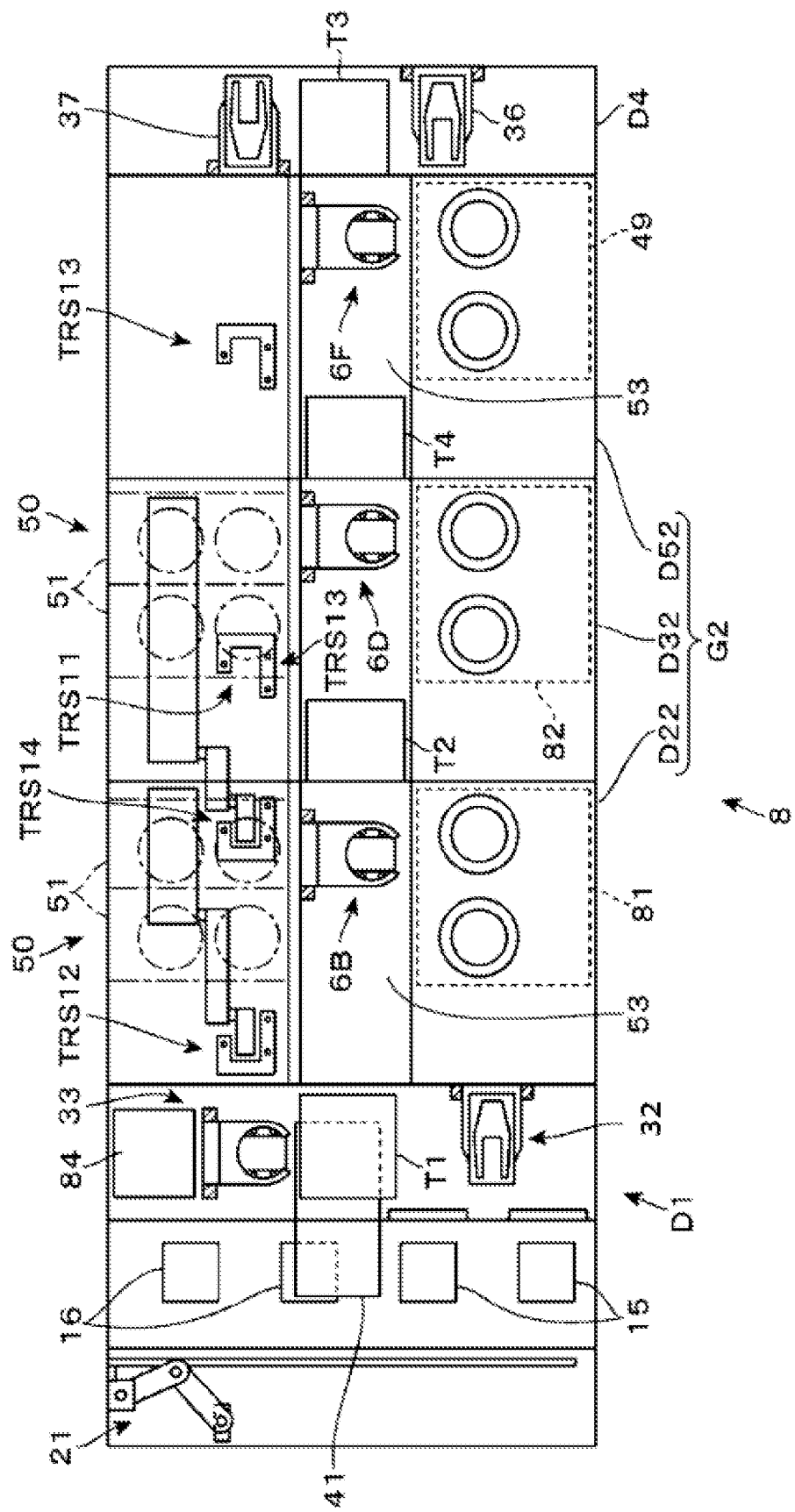
FIG. 10 is a horizontal sectional plan view of a coating and developing apparatus according to a second embodiment.
Figure 11:
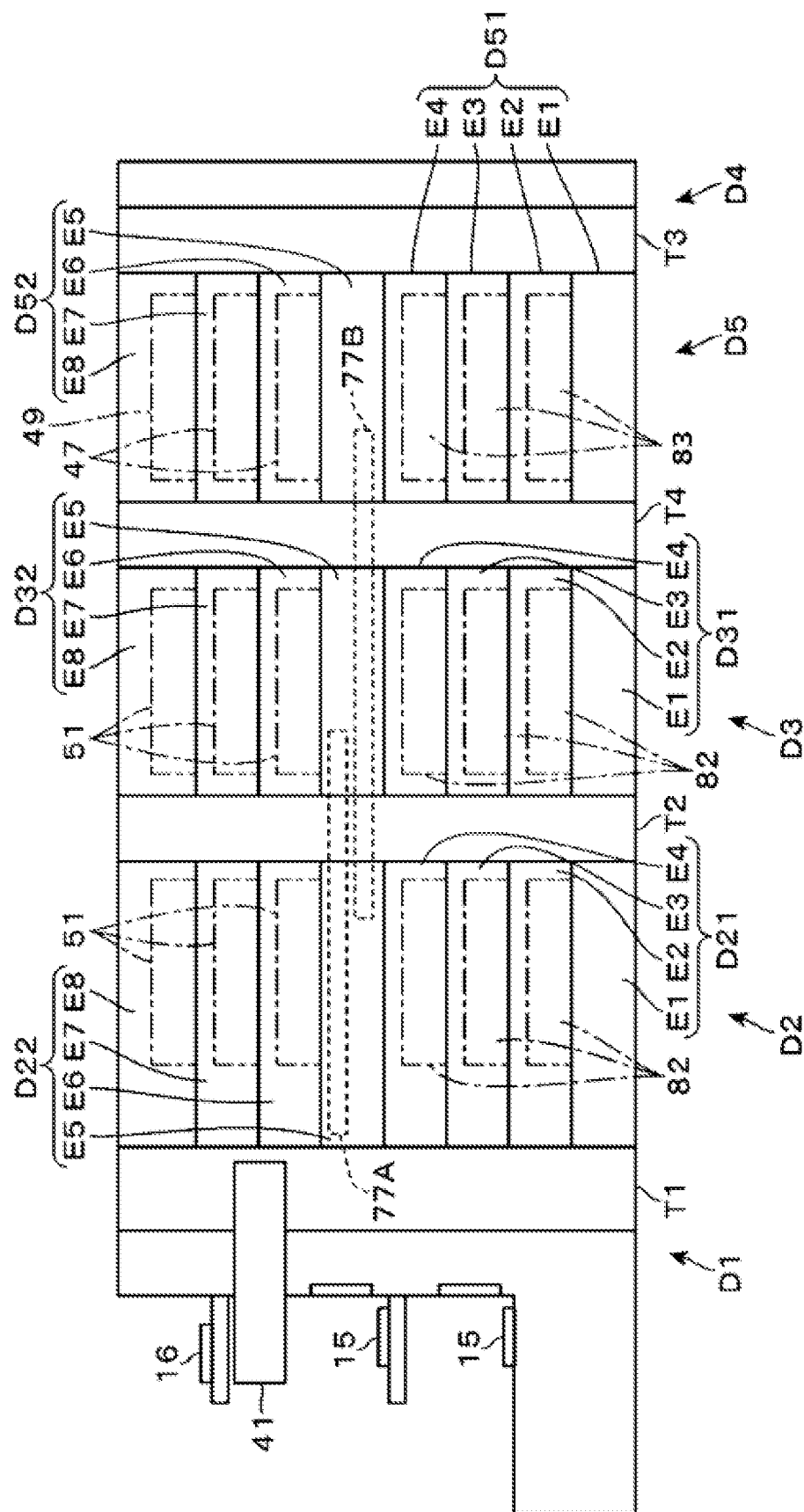
FIG. 11 is a vertical sectional front view of the coating and developing apparatus.

A coating and developing apparatus 8 which is a substrate processing apparatus of a second embodiment will be described with reference to a plan view of FIG. 10 and a front view of FIG. 11 focusing on differences from a coating and developing apparatus which is a modification of the substrate processing apparatus 1 described above. The coating and developing apparatus 8 includes a third processing block D5 located between and adjacent to the second processing block D3 and the interface block D4. The third processing block D5 is similar in configuration to the second processing block D3 and is partitioned into a third lower processing block D51 and a third upper processing block D52. Therefore, in the coating and developing apparatus 8, the lower processing block G1 includes the blocks D21, D31, and D51, and the upper processing block G2 includes the blocks D22, D32, and D52. In addition, the third processing block D5 includes a module-stacked body T4 formed by stacking an SCPL and a TRS in the same manner as the module-stacked body T2.

The third lower processing block D51 will be described later. Protective film forming modules 83 are provided as liquid processing modules in the layers E2 to E4 and are similar in configuration to the resist film forming modules 82, except that a chemical liquid for forming a protective film is supplied. As the modules forming the rear processing parts 50, heating modules 54 for removing solvent from a protective film and peripheral edge exposure modules 48 are included. The main transfer mechanism of the third lower processing block D51 will be referred to as a transfer mechanism 6E.

The third upper processing block D52 will be described later. Rear surface cleaning modules 47 are provided in the layers E6 and E7, a post-exposure cleaning module 49 is provided in the layer E8, and no rear processing part 50 is provided. A TRS13 is provided behind the transfer region 53 of the third upper processing block D52 instead of being provided in the second upper processing block D32. The main transfer mechanism of the third upper processing block D52 will be referred to as a transfer mechanism 6F.

The carrier block D1 of the coating and developing apparatus 8 is provided with a hydrophobic processing module 84 that supplies a processing gas to the wafer W to perform a hydrophobic process at the rear side of the transfer mechanism 33. The wafer W an image of which has been acquired by the pre-processing inspection module 41 as described above is transferred by the transfer mechanism 32 to a TRS provided separately from the TRS1 to TRS3 described above in the module-stacked body T1, transferred to the transfer mechanism 33, the hydrophobic processing module 84, the transfer mechanism 33, and the SCPL1 in the named order, and introduced into the first lower processing block D21.

Then, as in the apparatus of the modification of the first embodiment, the wafer W having an antireflection film and a resist film formed thereon by being subjected to a process in the first lower processing block D21 and the second lower processing block D31, is transferred to the module-stacked body T4. Then, the wafer W is transferred to the protective film forming module 83, the heating module 54, the peripheral edge exposure module 48 in the named order by the transfer mechanism 6E of the third lower processing block D51, and is then transferred to the module-stacked body T3. Thereafter, after being transferred between the TRSes of the module-stacked body T3, the wafer W is introduced into the third upper processing block D52 by the transfer mechanism 6F and is transferred to the rear surface cleaning module 47. Thereafter, the wafer W is introduced into the third upper processing block D52 again via the module-stacked body T3 and the exposure machine 20 and is transferred to the post-exposure cleaning module 49.

As in the substrate processing apparatus 1, the subsequent path is divided into a first path in which a process is performed by the first upper processing block D22 and a second path in which a process is performed by the second upper processing block D32. That is, through the first path, the wafer W is transferred to the TRS13 for a shuttle by the transfer mechanism 6F and is then transferred to the first upper processing block D22, or through the second path, the wafer W is transferred to the second upper processing block D32 via the module-stacked body T4. As described above, the number of processing blocks connected to the left and right sides is not limited to two as the configuration of the apparatus. The positions of TRSes for shuttles may be appropriately set according to the configuration of the processing blocks.

Third Embodiment

Figure 12:
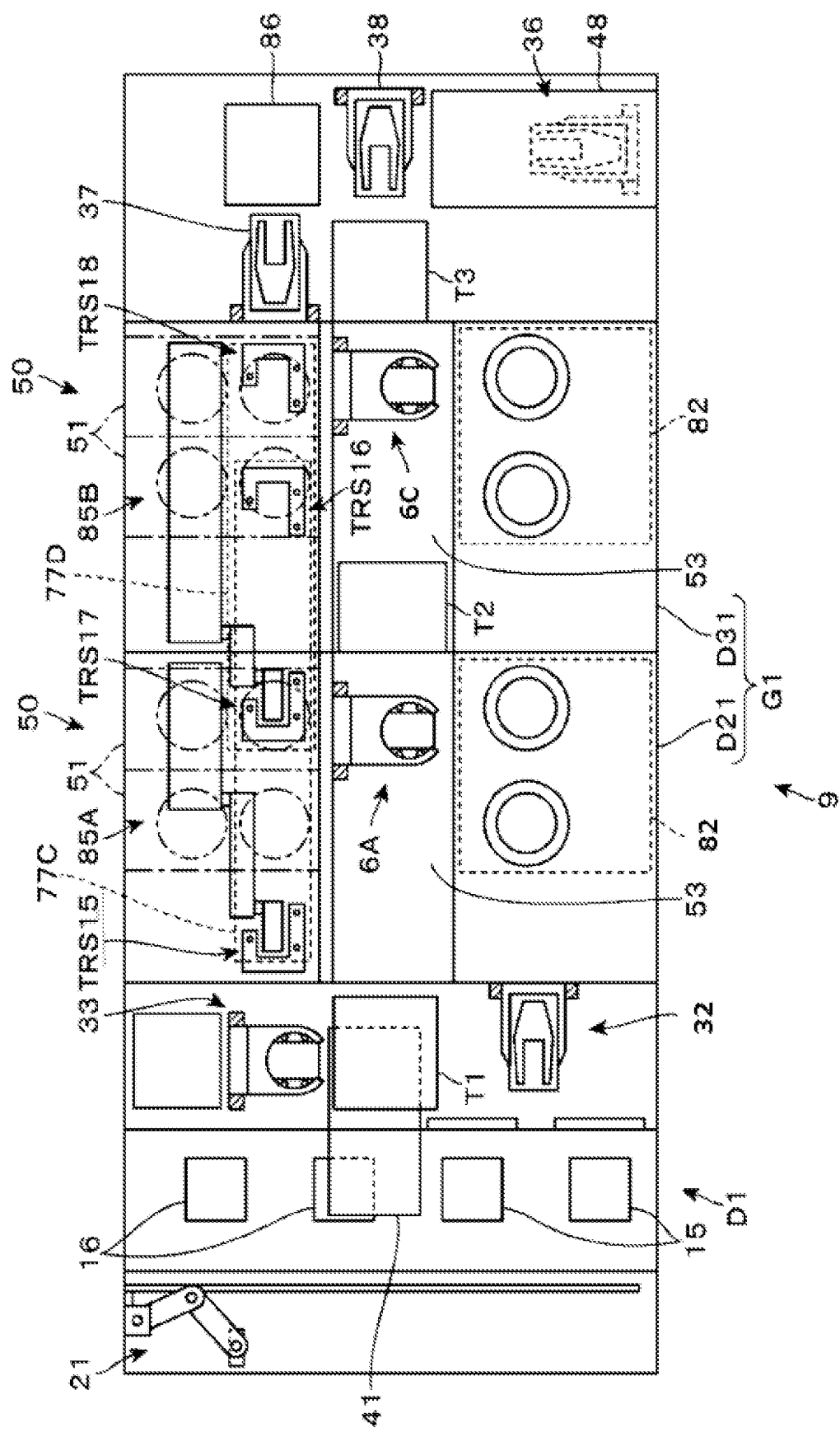
FIG. 12 is a horizontal sectional plan view of a coating and developing apparatus according to a third embodiment.
Figure 13:
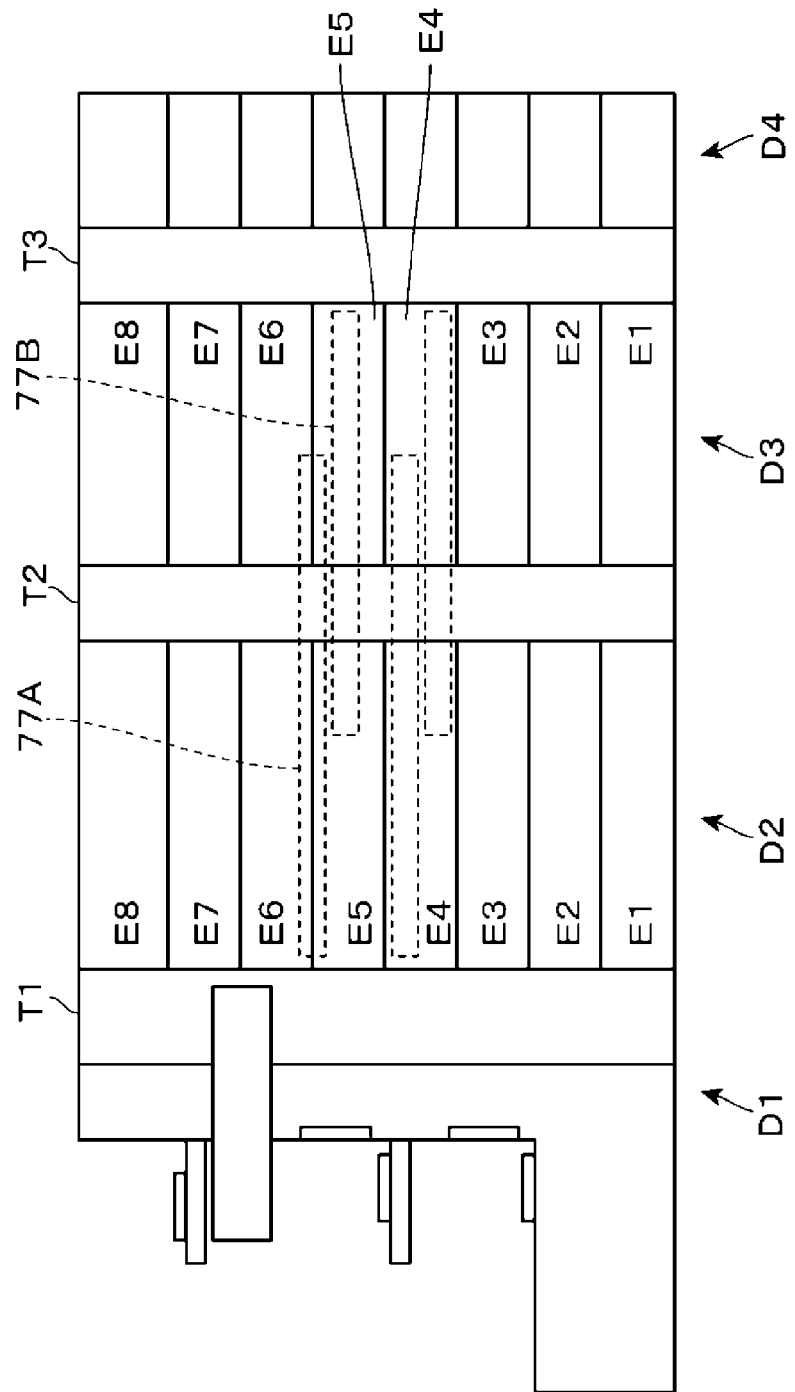
FIG. 13 is a vertical sectional front view of the coating and developing apparatus.
Figure 14:
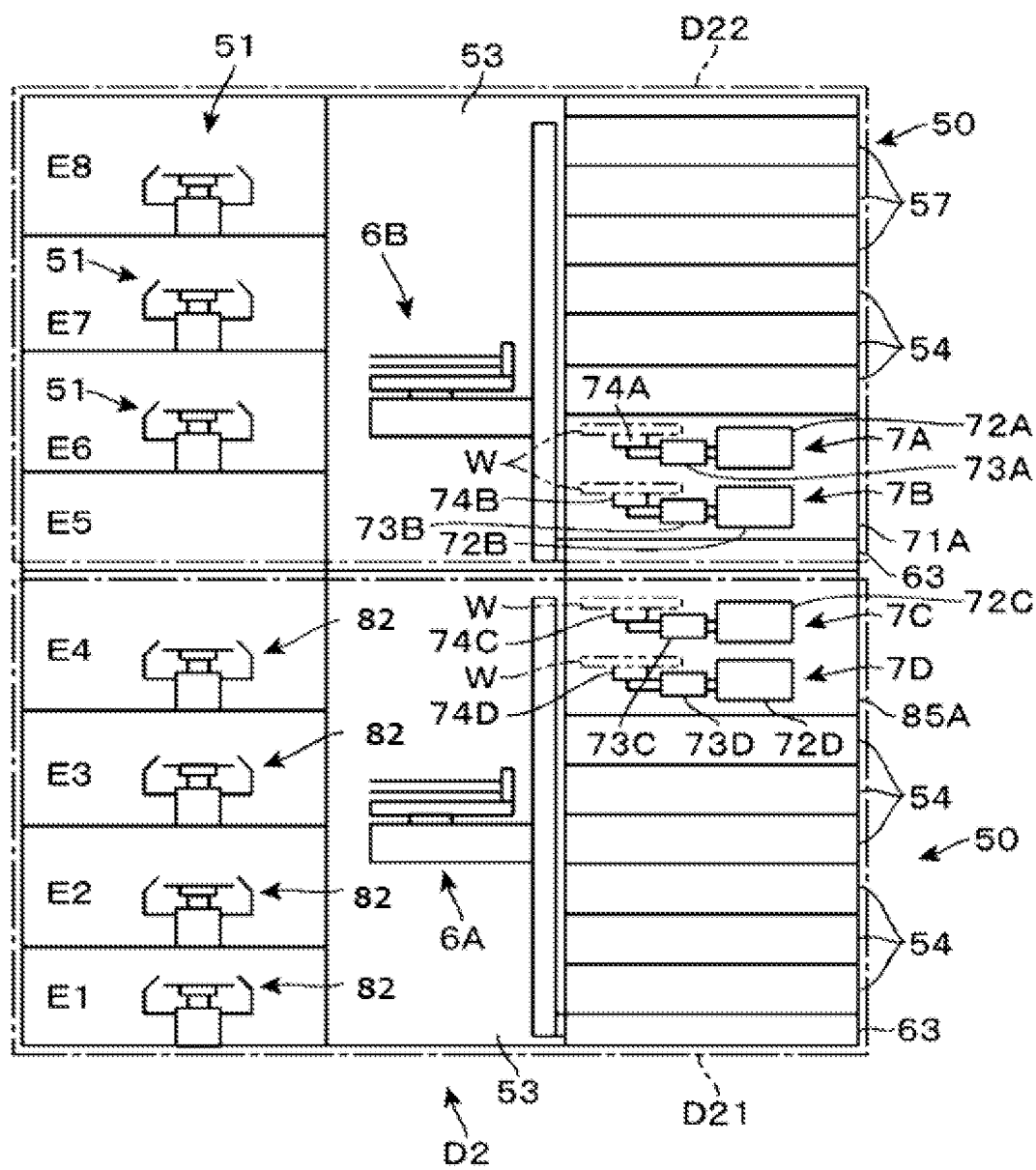
FIG. 14 is a vertical sectional right-side view of the coating and developing apparatus.

A coating and developing apparatus 9 of a third embodiment will be described with reference to a plan view of FIG. 12, a vertical sectional front view of FIG. 13, and a vertical sectional side view of FIG. 14 focusing on differences from the coating and developing apparatus of the above-described modification of the first embodiment. In the coating and developing apparatus 9, the formation of an antireflection film is not performed, and resist film forming modules 82 are respectively provided in the layers E1 to E4 of the first lower processing block D21 and the second lower processing block D31. Therefore, the first lower processing block D21 and the second lower processing block D31 perform the same process on wafers W. Shuttles 7C and 7D are provided in the first lower processing block D21 and the second lower processing block D31, respectively.

Unlike the shuttles 7A and 7B, the shuttles 7C and 7D transfer the wafer W from the side of the carrier block D1 toward the interface block D4. Specifically, the shuttle 7C is used to transfer the wafer W to the second lower processing block D31 for processing regardless of the transfer mechanism 6A, and the shuttle 7D is used to transfer the wafer W processed in the first lower processing block D21 toward the interface block D4 regardless of the transfer mechanism 6C. Like the shuttles 7A and 7B, the shuttles 7C and 7D each include a moving mechanism 72, a moving body 73, and a support 74. The reference numerals of these components will be indicated by adding the same alphabetic characters as the alphabetic characters representing the shuttles after the numbers. Therefore, for example, the reference numeral of the support of the shuttle 7C will be denoted by reference numeral 74C.

Spaces 85A and 85B corresponding to the above-described spaces 71A and 71B are formed at the upper side of the rear processing part 50 in each of the first lower processing block D21 and the second lower processing block D31. The space 85A and the space 85B are provided with the shuttle 7C and the shuttle 7D, respectively. The TRSes for the shuttle 7C will be referred to as a TRS15 and a TRS16, and the TRSes for the shuttle 7D will be referred to as a TRS17 and a TRS18. TRS15 and TRS17 are provided at the upstream side of the shuttle transfer path and have the same configuration as the TRS12. The TRS16 and TRS18 are provided at the downstream side of the shuttle transfer path and have the same configuration as the TRS11.

Regarding the TRS15 and TRS16 for the shuttle 7C, the TRS15 is provided at the left end portion of the first lower processing block D21, and the TRS16 is provided at a position on the left side of the module-stacked body T2 in the second lower processing block D31. The TRS17 and TRS18 for the shuttle 7D are provided at the right end of the first lower processing block D21 and the right end of the second lower processing block D31, respectively. Like the shuttles 7A and 7B, the shuttles 7C and 7D are provided at different heights. For example, the shuttle 7C is located higher than the shuttle 7D. Therefore, the TRS15 and the TRS16 are also located higher than the TRS17 and the TRS18.

The interface block D4 of the coating and developing apparatus 9 is provided with a transfer mechanism 38 having the same configuration as the transfer mechanism 38 at the right side of the module-stacked body T2, and a buffer module 86 is provided behind the transfer mechanism 38 to be accessible by the transfer mechanisms 37 and 38. A peripheral edge exposure module 48 is provided in front of the transfer mechanism 38 to be accessible by the transfer mechanism 38, and the wafer W can be transferred to the peripheral edge exposure module 48, the buffer module 86, the ICPL, and the exposure machine 20 in the named order via the module-stacked body T3.

As described in the second embodiment, the wafer W processed by the hydrophobic processing module 84 and transferred to the SCPL1 of the module-stacked body T1 is introduced into the first lower processing block D21 by the transfer mechanism 6A, or transferred to the TRS15 for a shuttle by the transfer mechanism 33. The wafer W transferred to the TRS15 is delivered to the shuttle 7C, the TRS16, and the transfer mechanism 6C in the named order, is subjected to a process by the second lower processing block D31, and then transferred to the module-stacked body T3, that is, to the interface block D4. The wafer W introduced into and processed by the first lower processing block D21 is transferred to the TRS17, the shuttle 7D, and the TRS18 in the named order, and is transferred to the interface block D4 by the transfer mechanism 37 to be exposed. The exposed wafer W is transferred via the first path and the second path, which use the shuttles 7A and 7B, respectively, and returned to the carrier block D1, as in the substrate processing apparatus 1.

As described above, the coating and developing apparatus 9 is provided with both the shuttles 7C and 7D for transferring the wafer from the side of the carrier block D1 toward the interface block D4, and the shuttles 7A and 7B for transferring the wafer W from the side of the interface block D4 toward the carrier block D1. This makes it possible to increase throughput. Since the loads of the transfer mechanisms 6A and 6B are reduced by the shuttles 7A and 7B, respectively, it is possible to obtain higher throughput. The shuttles 7C and 7D are provided at the side of the upper processing block G2 with respect to the rear processing part 50. Therefore, like the arrangement of the shuttles 7A and 7B described above, the throughput can be improved by suppressing the lifting amounts of the transfer mechanism 33 of the carrier block D1 and the transfer mechanism 37 of the interface block.

In the coating and developing apparatus 9, only the shuttles 7C and 7D may be provided, and the shuttles 7A and 7B may not be provided. That is, the transfer of the wafer W between the blocks D22 and D23 constituting the upper processing block G2 may be performed only by the transfer mechanisms 6B and 6D. That is, the substrate processing apparatus may have a configuration in which only one of a shuttle for the outward path from the side of the carrier block D1 toward the interface block D4 and a shuttle for the return path from the side of the interface block D4 toward the carrier block D1 is provided. In addition, instead of using the upper processing block G2 as the outward path and the lower processing block G1 as the return path, the upper processing block G2 may be used as the return path and the lower processing block G1 may be used as the outward path.

A TRS is interposed for delivery of the wafer W between a shuttle and the transfer mechanism 6A to 6D, which are the main transfer mechanisms of the processing blocks, but the wafer W may be delivered between a shuttle and the transfer mechanisms 6A to 6D. However, since the movement of the shuttle is restricted until the wafer W is received from the shuttle, it is preferable to interpose the TRS as described above. In addition, a liquid processing module is located at the front side, and a processing module constituting the rear processing part 50 is located at the rear side, but this layout may be reversed. For example, the substrate processing apparatus 1 may have a configuration in which the TRS12 for the shuttle 7A is disposed in the carrier block D1, and the TRS13 for the shuttle 7B is disposed in the interface block D4. The transfer mechanisms 33 and 37 may be made to be appropriately movable according to such an arrangement of the TRSes for shuttles. That is, the present disclosure is not limited to the configuration in which the TRSes for shuttles are provided in the processing block.

According to the present disclosure, it is possible to increase throughput in a substrate processing apparatus.

The liquid processing performed by the apparatus is not limited to the above-mentioned example, and may include a process of forming an insulating film through application of a chemical liquid, a process of coating an adhesive for adhering wafers W to each other, and the like. It shall be understood that the embodiments disclosed herein are examples in all respects and are not restrictive. The above-described embodiments may be omitted, replaced, modified, and combined in various forms without departing from the scope and spirit of the appended claims.

What is claimed is:

1. A substrate processing apparatus, comprising:
   a carrier block on which a carrier configured to store a substrate is placed;
   a first processing block including a first lower processing block and a first upper processing block and configured to deliver the substrate to and from the carrier block, the first lower processing block and the first upper processing block being stacked one above another, wherein the first processing block includes a plurality of layers, which are stacked one above another, and a first main transfer mechanism shared by each of the plurality of layers of the first processing block to transfer the substrate, and wherein each of the plurality of layers of the first processing block is provided with a processing module configured to process the substrate;
   a second processing block including a second lower processing block and a second upper processing block, which are adjacent, in a left-right direction, to the first lower processing block and the first upper processing block, respectively, and are stacked one above another, wherein the second processing block includes a plurality of layers, which are stacked one above another, and a second main transfer mechanism, which is different from the first main transfer mechanism, shared by each of the plurality of layers of the second processing block to transfer the substrate;
   a relay block including a lifting and transferring mechanism configured to deliver the substrate between the second lower processing block and the second upper processing block, wherein the relay block is located adjacent to the second processing block at a side opposite to a side at which the first processing block is located adjacent to the second processing block in the left-right direction;
   a controller configured to control an operation of each of the first main transfer mechanism and the second main transfer mechanism such that one of an upper processing block configured with the first upper processing block and the second upper processing block and a lower processing block configured with the first lower processing block and the second lower processing block forms an outward path through which the substrate is transferred from the carrier block to the relay block and the other one of the upper processing block and the lower processing block forms a return path through which the substrate is transferred from the relay block to the carrier block;
   a first shuttle that is provided for the first processing block in a bypass transfer path forming block, which is one of the upper processing block and the lower processing block, and is configured to operate to form the outward path or the return path together with the second main transfer mechanism, and wherein the first shuttle is different from the first main transfer mechanism and the second main transfer mechanism; and
   a second shuttle that is provided for the second processing block in the bypass transfer path forming block and is configured to operate to form the outward path or the return path together with the first main transfer mechanism, and wherein the second shuttle is different from the first main transfer mechanism, the second main transfer mechanism, and the first shuttle,
   wherein, with respect to the bypass transfer path forming block, the first shuttle is further configured to cause the substrate to be transferred to a downstream-side block by the second main transfer mechanism of the second processing block,
   wherein, with respect to the bypass transfer path forming block, the second shuttle is further configured to cause the substrate to be transferred to a downstream-side block by the first main transfer mechanism of the first processing block, and
   wherein the bypass transfer path forming block includes a plurality of layers, which are stacked one above another, and each of the plurality of layers of the bypass transfer path forming block is provided with a processing module configured to process the substrate.

2. The substrate processing apparatus of claim 1, wherein each of the first shuttle and the second shuttle is configured to transfer the substrate in the left-right direction.

3. The substrate processing apparatus of claim 2, wherein a first bypass transfer path, which is a transfer path through which the substrate is transferred by the first shuttle, protrudes toward a block constituting the bypass transfer path forming block of the second lower processing block and the second upper processing block, and
   a second bypass transfer path, which is a transfer path through which the substrate is transferred by the second shuttle, protrudes toward a block constituting the bypass transfer path forming block of the first lower processing block and the first upper processing block.

4. The substrate processing apparatus of claim 3, wherein the first bypass transfer path and the second bypass transfer path have different heights.

5. The substrate processing apparatus of claim 4, wherein the first bypass transfer path and the second bypass transfer path overlap each other in a plan view.

6. The substrate processing apparatus of claim 4, further comprising:
   a first bypass substrate placement part provided at each of an upstream side and a downstream side of the first bypass transfer path and configured to deliver the substrate to and from the first shuttle, and a second bypass substrate placement part, which is different from the first bypass substrate placement part, provided at each of an upstream side and a downstream side of the second bypass transfer path at a height different from a height of the first bypass substrate placement area and configured to deliver the substrate to and from the second shuttle.

7. The substrate processing apparatus of claim 6, wherein each of the first bypass substrate placement part and the second bypass substrate placement part is configured to move upward and downward and has a support part protruding upward to support a bottom surface of the substrate.

8. The substrate processing apparatus of claim 7, wherein with respect to one shuttle among the first shuttle and the second shuttle, one bypass transfer path corresponding to the one shuttle among the first bypass transfer path and the second bypass transfer path, and one bypass substrate placement part configured to deliver the substrate to and from the one shuttle among the first bypass substrate placement part and the second bypass substrate placement part, at a position at which the one shuttle delivers the substrate to the one bypass substrate placement part at the downstream side of the one bypass transfer path, the one shuttle is not located at the upstream side of the one bypass transfer path with respect to the support in a plan view.

9. The substrate processing apparatus of claim 2, wherein the first shuttle or the second shuttle includes a moving mechanism provided in each of the first processing block and the second processing block, a moving body configured to move in the left-right direction with respect to the moving mechanism, and a support configured to move in the left-right direction with respect to the moving body and to support the substrate.

10. The substrate processing apparatus of claim 9, wherein the moving body is configured to move between a position at which the moving body protrudes leftward with respect to the moving mechanism and a position at which the moving body protrudes rightward with respect to the moving mechanism, and the support is configured to move between a position at which the support protrudes leftward with respect to the moving body and a position at which the support protrudes rightward with respect to the moving body.

11. The substrate processing apparatus of claim 1, wherein, in each of the first lower processing block, the first upper processing block, the second lower processing block, and the second upper processing block, a main transfer path through which the substrate is transferred by the first main transfer mechanism or the second main transfer mechanism with respect to each of the plurality of layers is located at one side in an anteroposterior direction, and among the first lower processing block, the first upper processing block, the second lower processing block, and the second upper processing block, each block constituting the bypass transfer path forming block is provided with the first shuttle or the second shuttle at the one side in the anteroposterior direction in the main transfer path.

12. The substrate processing apparatus of claim 11, wherein each of the plurality of layers of the first processing block is provided with a liquid processing module configured to supply a processing liquid to the substrate, as the processing module of the first processing block.

13. The substrate processing apparatus of claim 12, wherein at least one of the blocks constituting the bypass transfer path forming block is provided with a stacked body including a plurality of processing modules at the one side in the anteroposterior direction in the main transfer path, the plurality of processing modules being configured to perform, on the substrate, a process that is different from a process performed by the liquid processing module, and with respect to the stacked body of the plurality of processing modules, the first shuttle and the second shuttle are provided at a side of a block connected to the bypass transfer path forming block from a lower side or an upper side of the upper processing block and the lower processing block.

14. The substrate processing apparatus of claim 1, wherein each of the first lower processing block and the first upper processing block is provided with the first shuttle, each of the second lower processing block and the second upper processing block is provided with the second shuttle, and each of the upper processing block and the lower processing block constitutes the bypass transfer path forming block.

15. The substrate processing apparatus of claim 1, wherein the first lower processing block includes a plurality of layers, which are stacked one above another, and the first main transfer mechanism shared by each of the plurality of layers of the first lower processing block to transfer the substrate, wherein the first upper processing block includes a plurality of layers, which are stacked one above another, and a third main transfer mechanism shared by each of the plurality of layers of the first upper processing block to transfer the substrate, wherein the second lower processing block includes a plurality of layers, which are stacked one above another, and the second main transfer mechanism shared by each of the plurality of layers of the second lower processing block to transfer the substrate, wherein the second upper processing block includes a plurality of layers, which are stacked one above another, and a fourth main transfer mechanism shared by each of the plurality of layers of the second upper processing block to transfer the substrate, wherein the third main transfer mechanism is different from the first main transfer mechanism, the second main transfer mechanism, the first shuttle, and the second shuttle, and wherein the fourth main transfer device is different from the first main transfer mechanism, the second main transfer mechanism, the third main transfer mechanism, the first shuttle, and the second shuttle.

16. The substrate processing apparatus of claim 1, further comprising:

a first bypass substrate placement part provided at each of an upstream side and a downstream side of a first bypass transfer path, which is a transfer path through which the substrate is transferred by the first shuttle, and configured to deliver the substrate to and from the first shuttle, and a second bypass substrate placement part, which is different from the first bypass substrate placement part, provided at each of an upstream side and a downstream side of a second bypass transfer path, which is a transfer path through which the substrate is transferred by the second shuttle, at a height different from a height of the first bypass substrate placement area and configured to deliver the substrate to and from the second shuttle.

17. A substrate processing method used in a substrate processing apparatus that includes:
a carrier block on which a carrier configured to store a substrate is placed;
a first processing block including a first lower processing block and a first upper processing block and configured to deliver the substrate to and from the carrier block, the first lower processing block and the first upper processing block being stacked one above another, wherein the first processing block includes a plurality of layers, which are stacked one above another, and a first main transfer mechanism shared by each of the plurality of layers of the first processing block to transfer the substrate, and wherein each of the plurality of layers of the first processing block is provided with a processing module configured to process the substrate;
a second processing block including a second lower processing block and a second upper processing block, which are adjacent, in a left-right direction, to the first lower processing block and the first upper processing block, respectively, and are stacked one above another, wherein the second processing block includes a plurality of layers, which are stacked one above another, and a second main transfer mechanism, which is different from the first main transfer mechanism, shared by each of the plurality of layers of the second processing block to transfer the substrate; and
a relay block including a lifting and transferring mechanism configured to deliver the substrate between the second lower processing block and the second upper processing block, wherein the relay block is located adjacent to the second processing block at a side opposite to a side at which the first processing block is located adjacent to the second processing block in the left-right direction, the method comprising:
transferring the substrate by each of the first main transfer mechanism and the second main transfer mechanism such that one of an upper processing block configured with the first upper processing block and the second upper processing block and a lower processing block configured with the first lower processing block and the second lower processing block forms an outward path through which the substrate is transferred from the carrier block to the relay block and the other one of the upper processing block and the lower processing block forms a return path through which the substrate is transferred from the relay block to the carrier block;
transferring the substrate such that the outward path or the return path is formed by a first shuttle, which is different from the first main transfer mechanism and the second main transfer mechanism, provided in the first processing block in a bypass transfer path forming block which is one of the upper processing block and the lower processing block together with the second main transfer mechanism;
transferring the substrate such that the outward path or the return path is formed by a second shuttle, which is different from the first main transfer mechanism device, the second main transfer mechanism, and the first shuttle, provided in the second processing block in the bypass transfer path forming block together with the first main transfer mechanism;
transferring, with respect to the bypass transfer path forming block, the substrate to a downstream-side block by the second main transfer mechanism of the second processing block and first shuttle; and
transferring, with respect to the bypass transfer path forming block, the substrate to a downstream-side block by the first main transfer mechanism of the first processing block and the second shuttle,
wherein the bypass transfer path forming block includes a plurality of layers, which are stacked one above another, and each of the plurality of layers of the bypass transfer path forming block is provided with a processing module configured to process the substrate.

* * * * *